United States Patent
Yamakawa et al.

(10) Patent No.: US 10,473,274 B2
(45) Date of Patent: Nov. 12, 2019

(54) WHITE LIGHT SOURCE SYSTEM

(71) Applicants: KABUSHIKI KAISHA TOSHIBA, Tokyo (JP); TOSHIBA MATERIALS CO., LTD., Yokohama-shi, Kanagawa-ken (JP)

(72) Inventors: Masahiko Yamakawa, Yokohama Kanagawa (JP); Ryoji Tsuda, Fujisawa Kanagawa (JP); Yasumasa Ooya, Chigasaki Kanagawa (JP); Tatsunori Itoga, Kamakura Kanagawa (JP); Yasuhiro Shirakawa, Yokohama Kanagawa (JP); Junji Taniguchi, Yokosuka Kanagawa (JP)

(73) Assignees: Kabushiki Kaisha Toshiba, Tokyo (JP); Toshiba Materials Co., Ltd., Kanagawa-ken (JP)

( * ) Notice: Subject to any disclaimer, the term of this patent is extended or adjusted under 35 U.S.C. 154(b) by 153 days.

(21) Appl. No.: 15/849,346

(22) Filed: Dec. 20, 2017

(65) Prior Publication Data

US 2018/0135813 A1    May 17, 2018

Related U.S. Application Data

(63) Continuation of application No. PCT/JP2016/068715, filed on Jun. 23, 2016.

(30) Foreign Application Priority Data

Jun. 24, 2015 (JP) .................................. 2015-126775

(51) Int. Cl.
*F21K 9/60* (2016.01)
*C09K 11/59* (2006.01)
(Continued)

(52) U.S. Cl.
CPC ................ *F21K 9/60* (2016.08); *C09K 11/59* (2013.01); *C09K 11/64* (2013.01); *C09K 11/71* (2013.01);
(Continued)

(58) Field of Classification Search
CPC .... F21K 9/60; F21K 2113/13; F21K 2115/10; H01L 33/00; H01L 33/50; C09K 11/59;
(Continued)

(56) References Cited

U.S. PATENT DOCUMENTS 9,112,120 B2 * 8/2015 Yamakawa ............. H01L 35/50
2009/0251057 A1   10/2009 Son et al.
(Continued)

FOREIGN PATENT DOCUMENTS

CN         104025321 A      9/2014
EP         2164301 A2       3/2010
(Continued)

*Primary Examiner* — Seahvosh Nikmanesh
(74) *Attorney, Agent, or Firm* — Harness, Dickey & Pierce, PLC

(57) ABSTRACT

According to one embodiment, there is provided a white light source system including white light sources. An absolute value of a difference between $(P(\lambda) \times V(\lambda))/(P(\lambda max1) \times V(\lambda max1))$ and $(B(\lambda) \times V(\lambda))/(B(\lambda max2) \times V(\lambda max2))$ for each of the white light sources satisfies a relational expression represented by $|((P(\lambda) \times V(\lambda))/(P(\lambda max1) \times V(\lambda max1)) - (B(\lambda) \times V(\lambda))/(B(\lambda max2) \times V(\lambda max2))| \leq 0.15$ The white light source system has a light emission characteristic of white light emitted by the system is continuously changed along with an elapse of time by changing a mixing ratio of light beams from the white light sources.

12 Claims, 24 Drawing Sheets

(51) Int. Cl.
*C09K 11/64* (2006.01)
*C09K 11/71* (2006.01)
*H05B 37/02* (2006.01)
*H01L 33/50* (2010.01)
*H05B 33/08* (2006.01)
*H01L 33/00* (2010.01)
*C09K 11/77* (2006.01)
*H05B 33/10* (2006.01)
*F21Y 113/13* (2016.01)
*F21Y 115/10* (2016.01)

(52) U.S. Cl.
CPC .......... *C09K 11/7734* (2013.01); *H01L 33/00* (2013.01); *H01L 33/50* (2013.01); *H05B 33/0857* (2013.01); *H05B 33/10* (2013.01); *H05B 37/02* (2013.01); *F21Y 2113/13* (2016.08); *F21Y 2115/10* (2016.08); *Y02B 20/181* (2013.01); *Y02B 20/42* (2013.01)

(58) Field of Classification Search
CPC ..... C09K 11/64; C09K 11/71; C09K 11/7734; H05B 33/0857; H05B 33/10; H05B 37/02; Y02B 20/181; Y02B 20/42
See application file for complete search history.

(56) References Cited

U.S. PATENT DOCUMENTS

| | | |
|---|---|---|
| 2010/0063566 A1 | 3/2010 | Uchiumi et al. |
| 2011/0006325 A1 | 1/2011 | Ishii et al. |
| 2013/0307011 A1 | 11/2013 | Yamakawa et al. |
| 2014/0036499 A1 | 2/2014 | Yamakawa et al. |
| 2014/0211463 A1 | 7/2014 | Hasumi et al. |
| 2014/0284636 A1 | 9/2014 | Yamakawa et al. |
| 2015/0316218 A1 | 11/2015 | Harbers et al. |
| 2016/0049558 A1 | 2/2016 | Ishii et al. |

FOREIGN PATENT DOCUMENTS

| | | |
|---|---|---|
| EP | 2674662 A1 | 12/2013 |
| EP | 2953174 A1 | 12/2015 |
| JP | H08193738 A | 7/1996 |
| JP | 2006049799 A | 2/2006 |
| JP | 2007265818 A | 10/2007 |
| JP | 2009123429 A | 6/2009 |
| JP | 2009540599 A | 11/2009 |
| JP | 2011023339 A | 2/2011 |
| JP | 2012113959 A | 6/2012 |
| JP | 2013521617 A | 6/2013 |
| JP | 2013/171684 A | 9/2013 |
| JP | 2014054290 A | 3/2014 |
| JP | 2014/168051 A | 9/2014 |
| JP | 2015106515 A | 6/2015 |
| WO | WO2008069101 A1 | 3/2010 |
| WO | WO2009072539 A1 | 4/2011 |
| WO | WO 2011/109150 A1 | 9/2011 |
| WO | WO2012108065 A1 | 7/2014 |
| WO | WO2012144087 A1 | 7/2014 |
| WO | WO 2014119313 A1 | 8/2014 |
| WO | WO2013061942 A1 | 4/2015 |

* cited by examiner

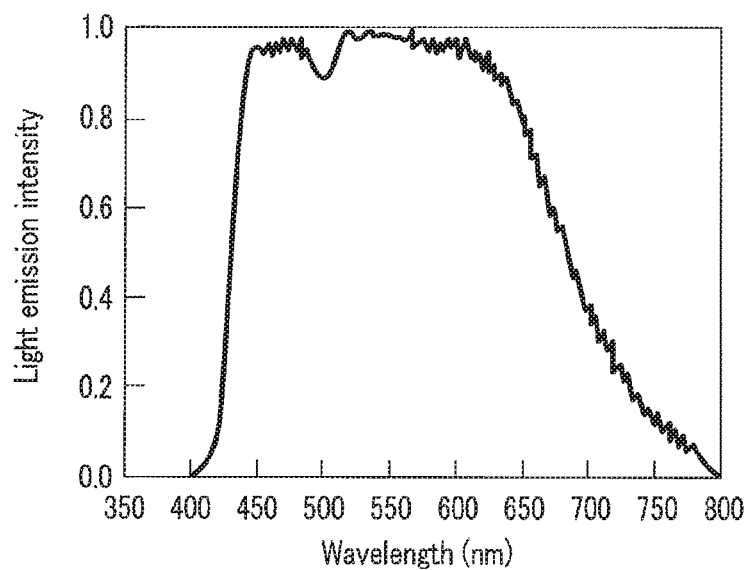
F I G. 3
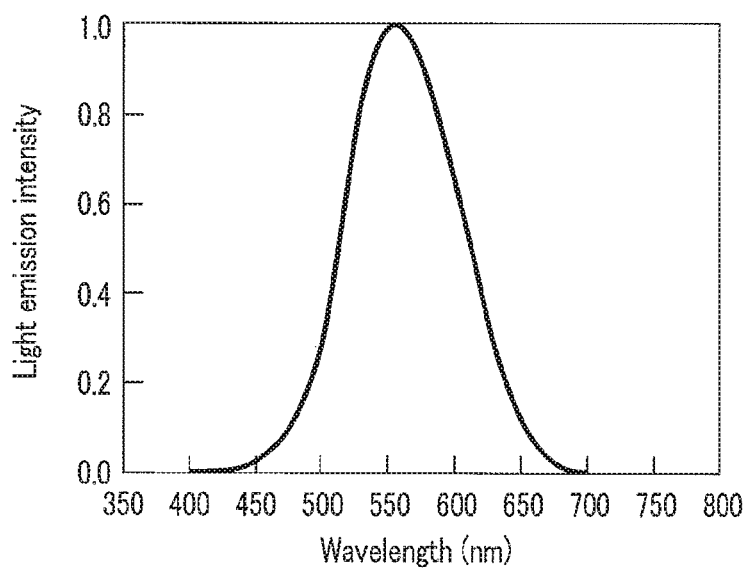
F I G. 4

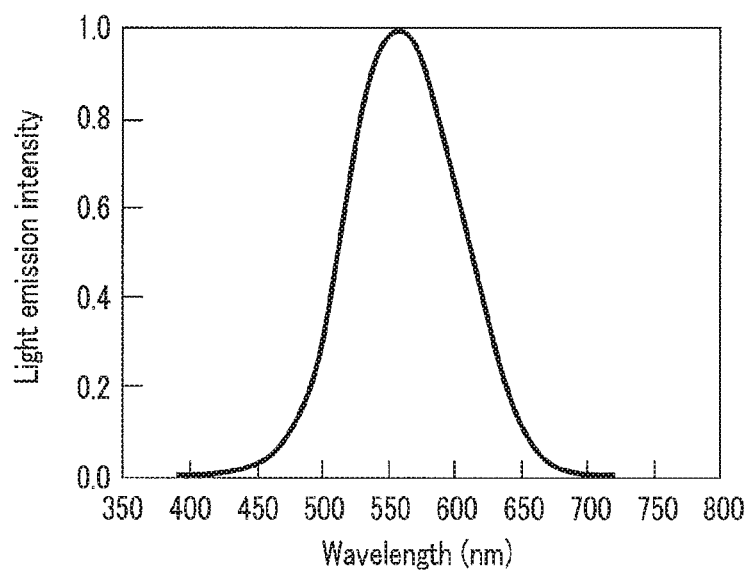
F I G. 5
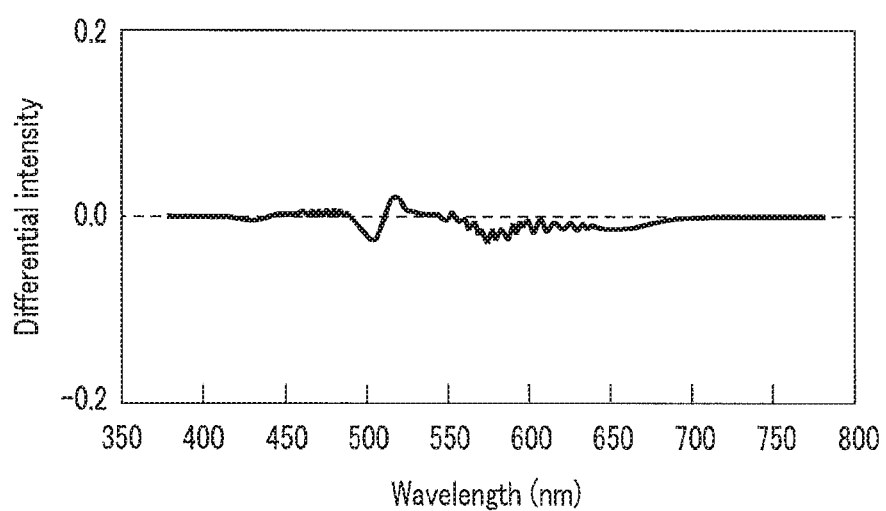
F I G. 6

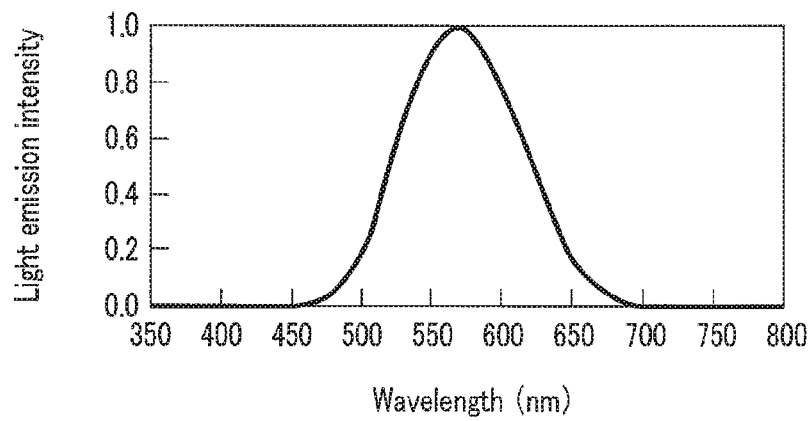
F I G. 12
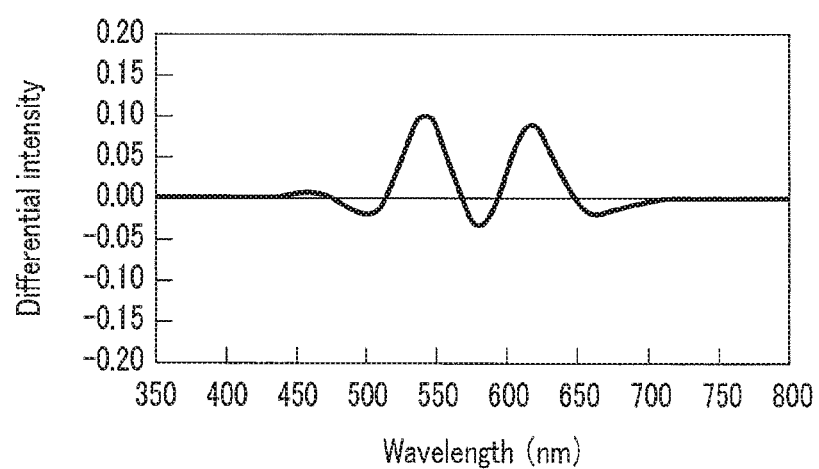
F I G. 13

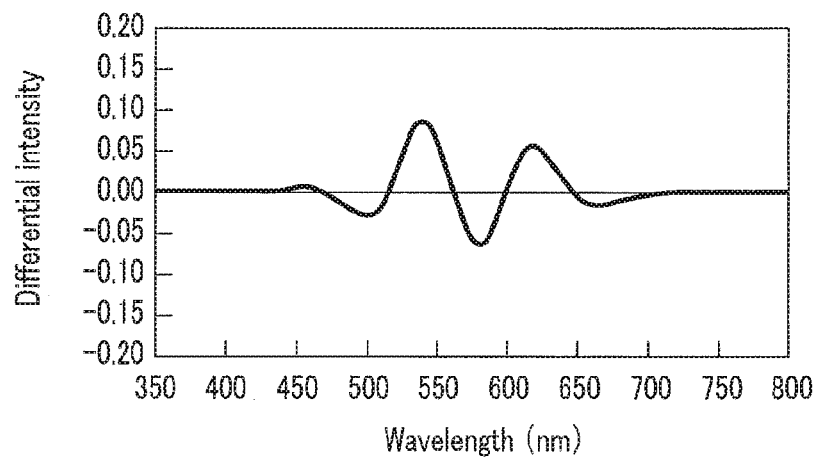
F I G. 16
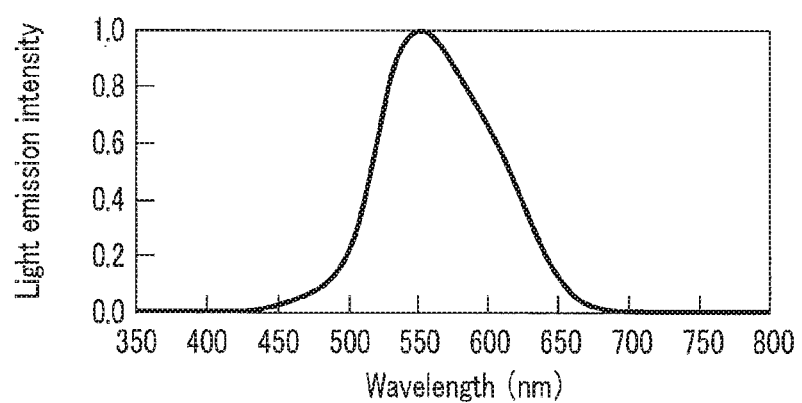
F I G. 17

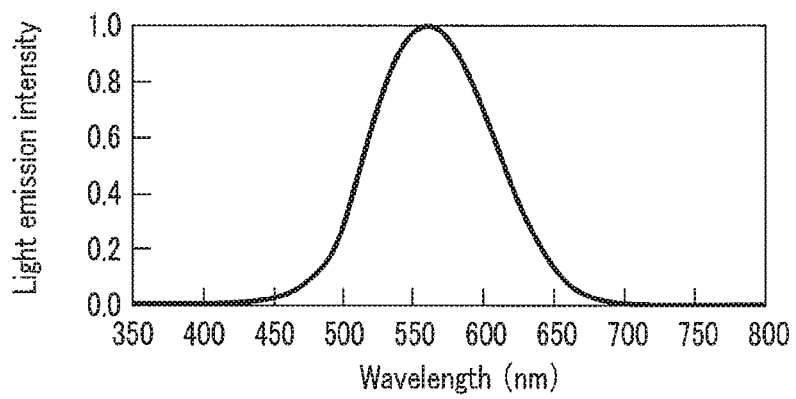
F I G. 18
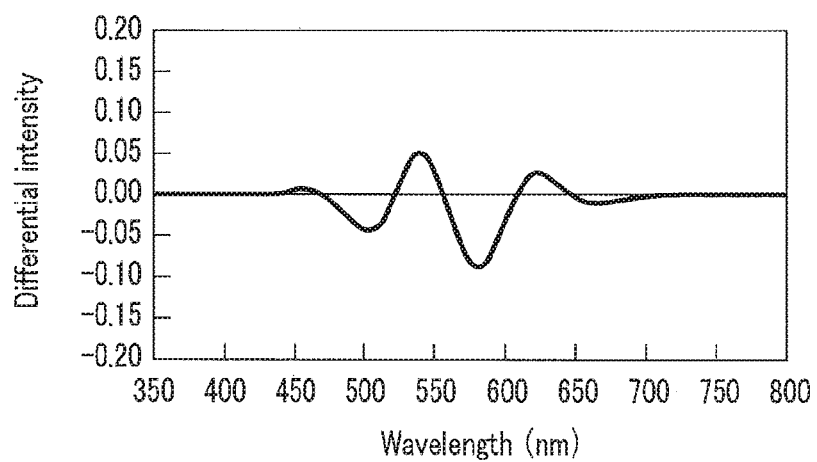
F I G. 19

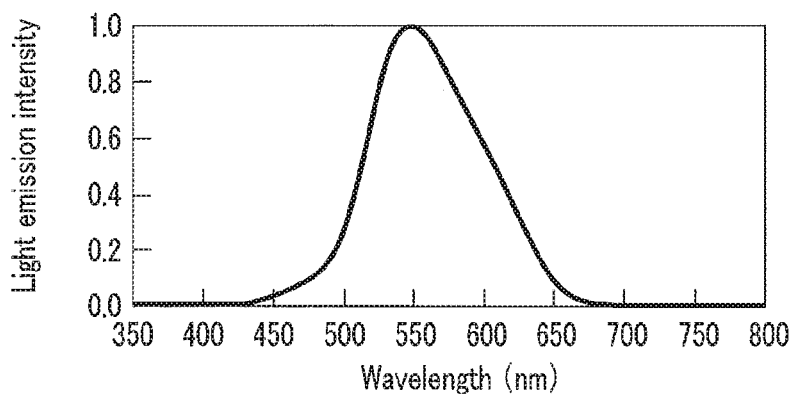
F I G. 20
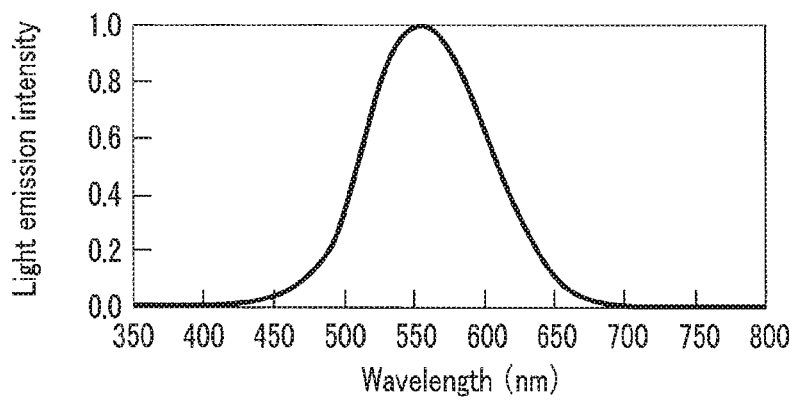
F I G. 21

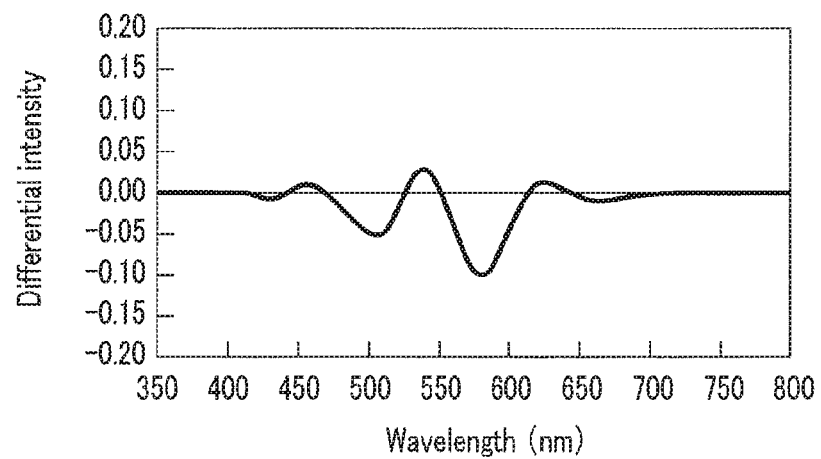
F I G. 22
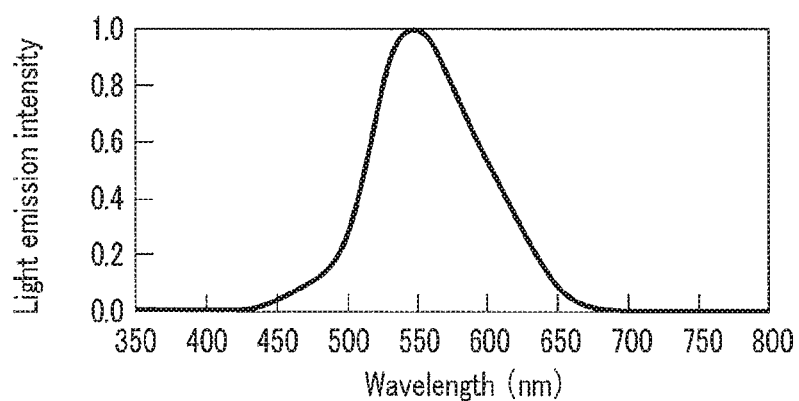
F I G. 23

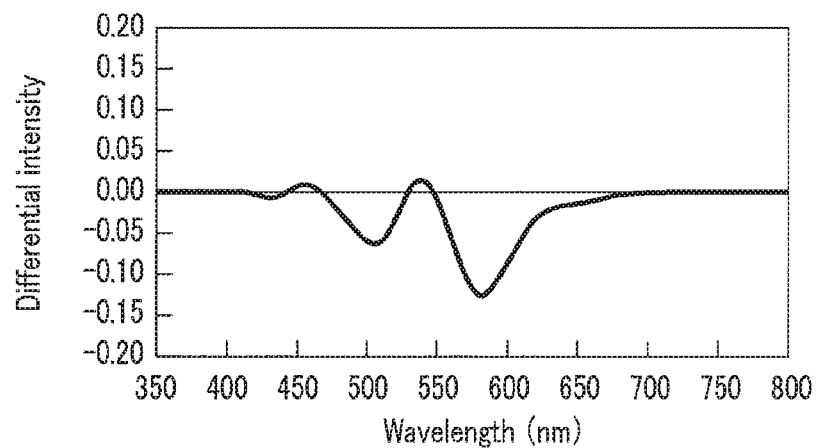
F I G. 28
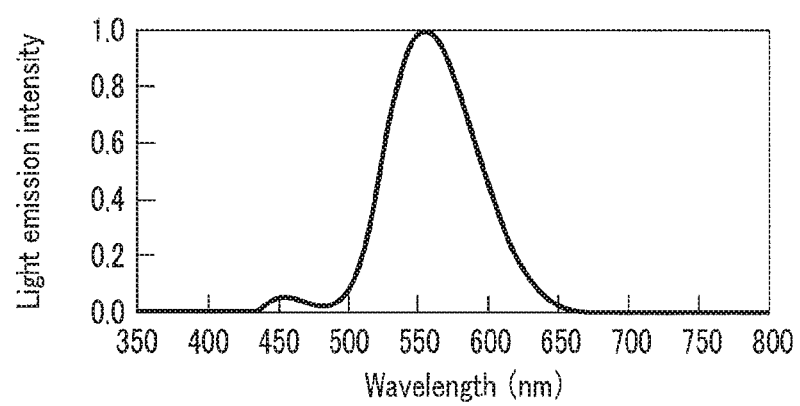
F I G. 29

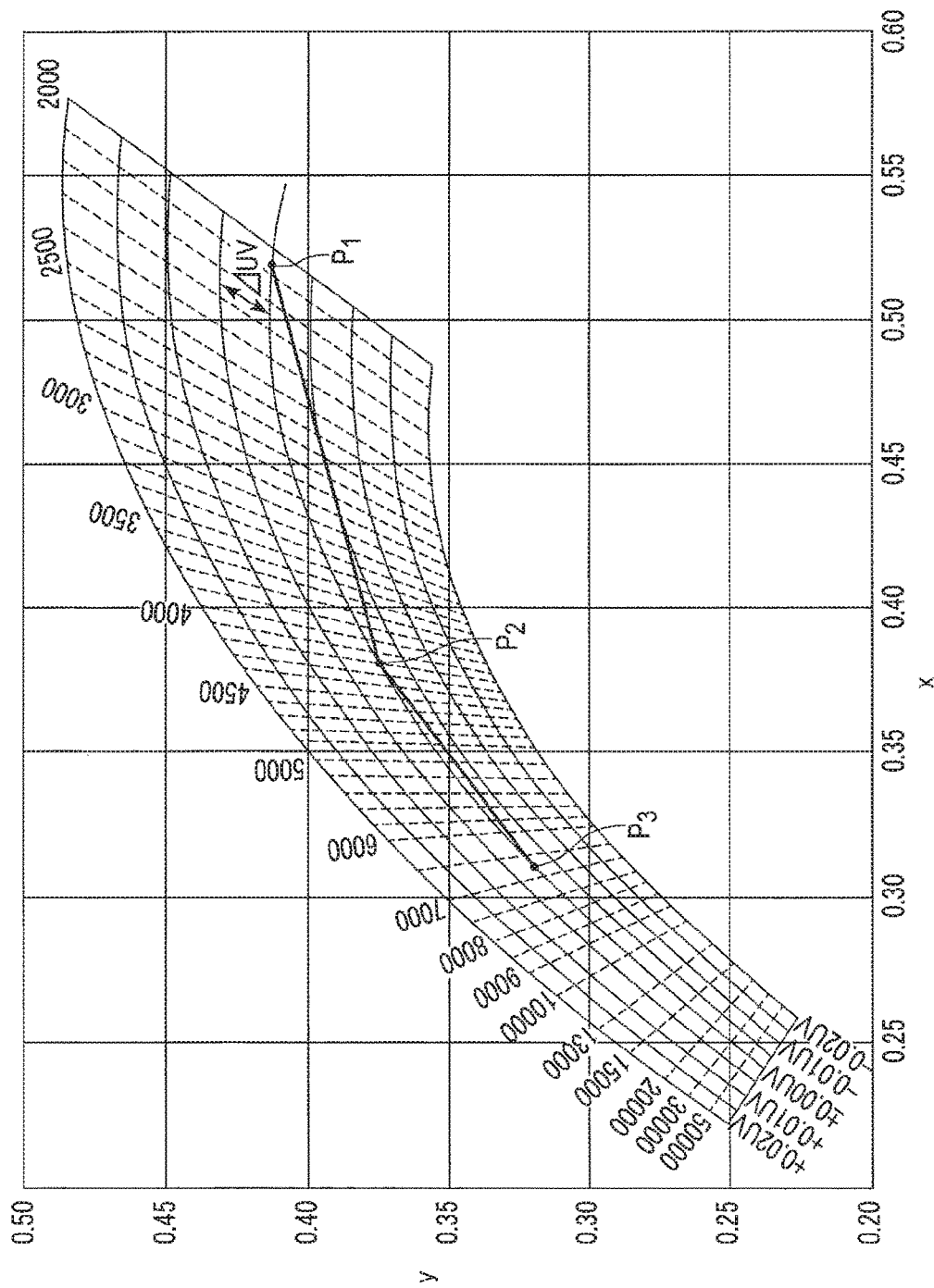
F I G. 32

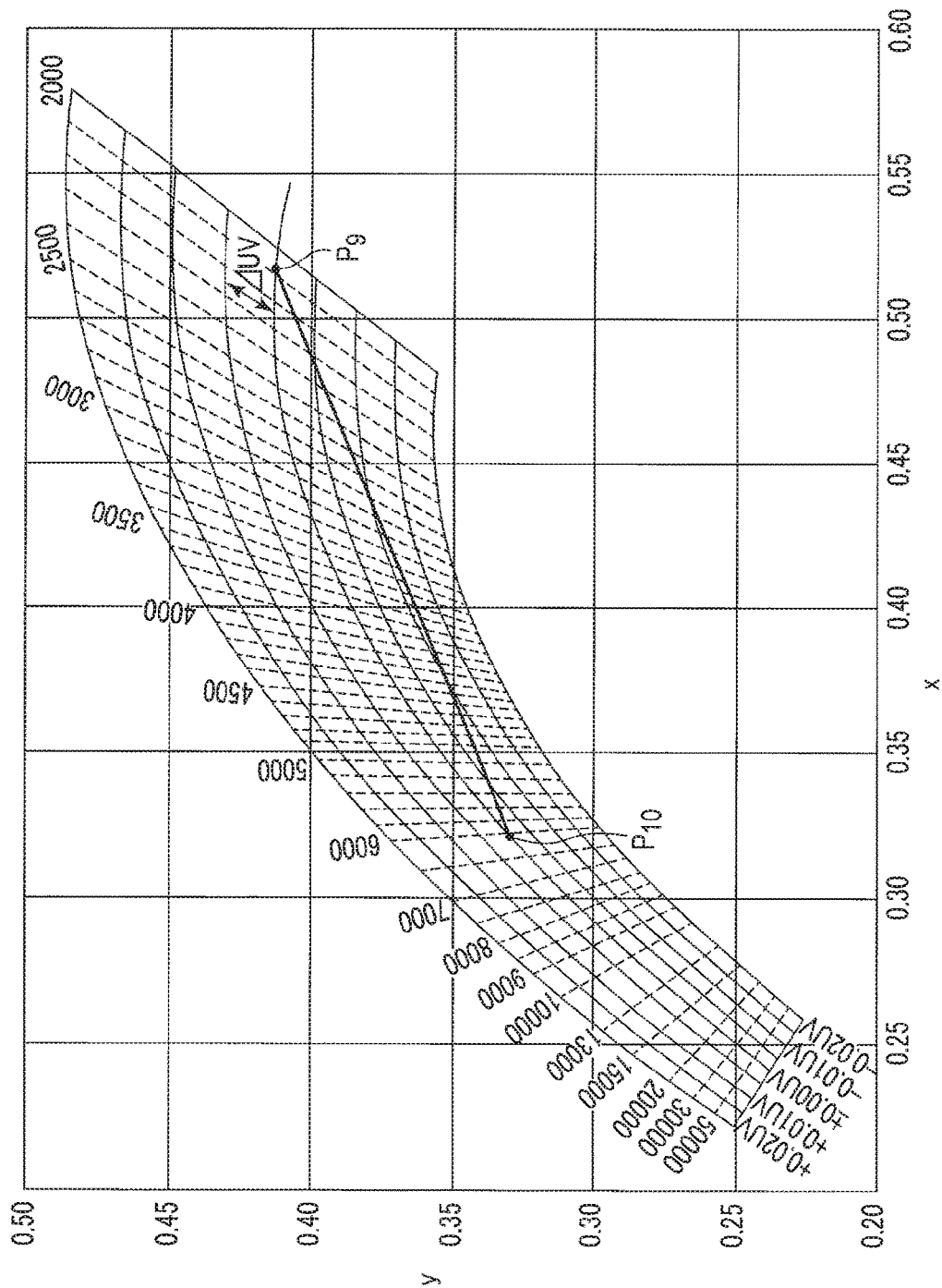
F I G. 36

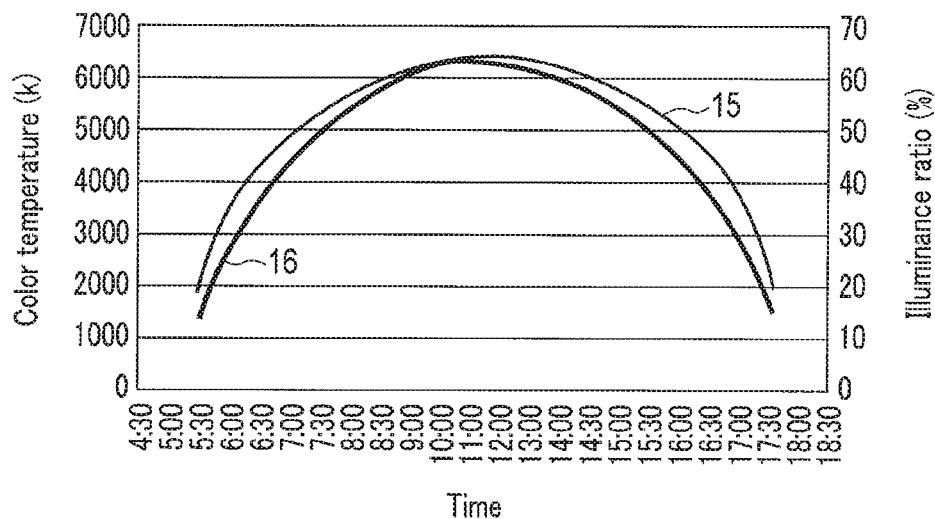
F I G. 41
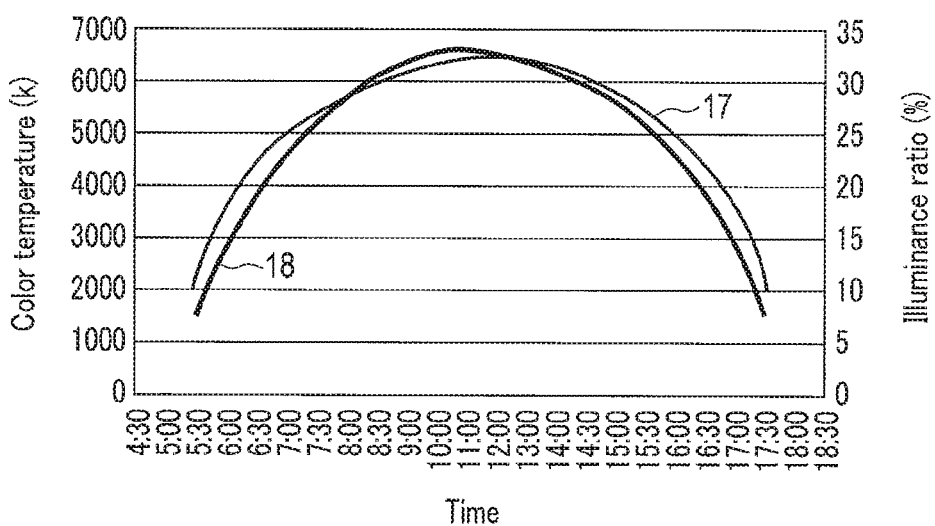
F I G. 42

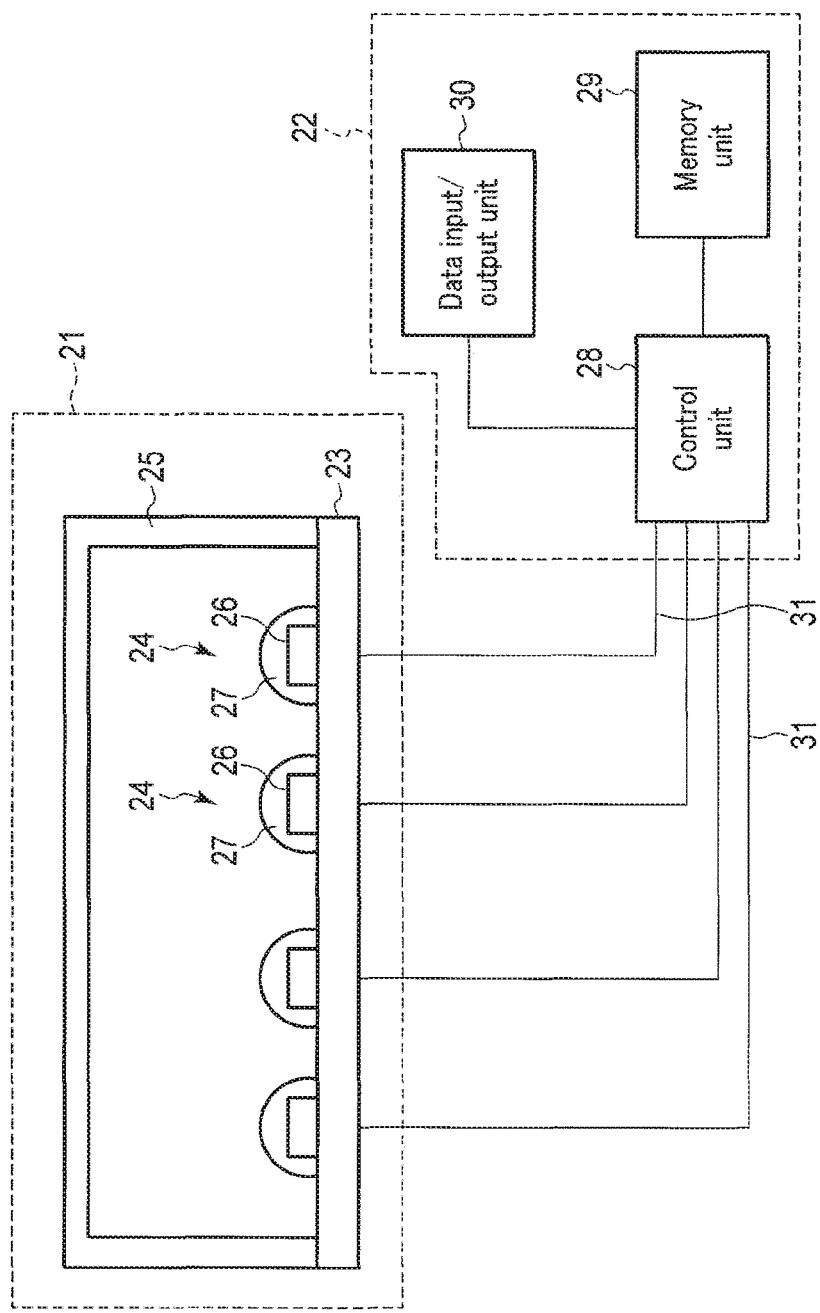
F I G. 43

WHITE LIGHT SOURCE SYSTEM

CROSS-REFERENCE TO RELATED APPLICATIONS

This application is a Continuation Application of PCT Application No. PCT/JP2016/068715, filed Jun. 23, 2016 and based upon and claiming the benefit of priority from Japanese Patent Application No. 2015-126775, filed Jun. 24, 2015, the entire contents of all of which are incorporated herein by reference.

FIELD

The present invention relates to a white light source system characterized by being capable of continuously and correctly reproducing the emission spectrum shape and the emission intensity of sunbeams, which change along with the elapse of time.

BACKGROUND

In recent years, light sources using LEDs (Light Emitting Diodes) have attracted attention from the viewpoint of energy saving and reduction of the amount of emitted carbon dioxide. As compared with incandescent bulbs using tungsten filaments, LEDs have longer life and enable energy saving. Because of the convenience, LED illuminations have rapidly developed their market. Many of initial LED illuminations are of a type for obtaining white light by combining an LED that emits blue light and a phosphor that emits yellow light. They can only reproduce unnatural white without warmth. However, the performance remarkably improves as the market of LED products is expanded. As a result of improvements concerning the combination of LEDs and phosphors, various kinds of LED white light sources have been developed.

For example, patent literature 1 discloses a lighting apparatus capable of reproducing five types of white light. LEDs and various phosphors are combined to prepare two types of LEDs which emit white light having a high color temperature and white light having a low color temperature. The light emissions are mixed at various ratios, thereby obtaining five types of white light, that is, incandescent bulb color, warm white, white, daytime white, and daylight white. In an interior illumination, the plural of types of white light are selectively used as needed, thereby obtaining an illumination rendering effect according to a purpose in various scenes of daily life.

On the other hand, recently, illuminations that not only provide a rendering effect but also consider the influences of white light on human bodies have been developed. As a movement, since there is a fear that strong light emitted by a blue LED may have an adverse effect on human bodies, for example, an effect of suppressing secretion of a hormone (melatonin) in human bodies, an illumination that reduces the influence of blue light has been proposed. For example, in patent literature 2, instead of simply reducing the intensity of blue light, LEDs and phosphors having different light emission peaks are combined, and four types of light emission peaks are thus mixed, thereby providing white light in which the influence of blue light is small, and the deviation from the spectral luminous efficiency is small.

As another movement, LED light sources are positively used to recover or build up physical fitness. For example, there is an attempt to directly reproduce sunbeams gentle to human bodies and positively exert influence on the internal clocks of human bodies to promote health. Patent literatures 3 and 7 are inventions directed to a white light source having the same emission spectrum as sunbeams, in each of which sunbeams of different color temperatures are reproduced by the spectrum of black-body radiation having the same color temperature. In the inventions, white illuminations which are approximated to sunbeams having various color temperatures and spectrum shapes, and capable of coping with the rhythm of an internal clock can be obtained. Patent literature 4 is an invention directed to a control apparatus that includes a means for detecting the illuminance or temperature around a human body and, based on the acquired data, adjusts the illumination or air conditioning around the human body in accordance with the biological rhythm. Patent literature 5 is an invention directed to an illumination system using a white light source. This invention is directed to an office illumination or the like which mainly illuminates humans. This system can adjust the color temperature or illuminance of indoor light while detecting a change in outdoor light. A white illumination corresponding to a physiological phenomenon of a human body or a seasonal change can be obtained. Finally, patent literature 6 is an invention directed to an artificial sunbeam system that combines a plural of light emitting diode modules of different color temperatures. This system can reproduce a time-rate change of the color temperature of sunbeams with which a point of a different latitude or longitude on the earth is irradiated.

CITATION LIST

Patent Literatures

Patent Literature 1: Jpn. Pat. Appln. KOKAI Publication No. 2007-265818
Patent Literature 2: International Patent Publication No. 2008/069101
Patent Literature 3: International Patent Publication No. 2012/144087
Patent Literature 4: Jpn. Pat. Appln. KOKAI Publication No. 8-193738
Patent Literature 5: Jpn. Pat. Appln. KOKAI Publication No. 2011-23339
Patent Literature 6: Jpn. PCT National Publication No. 2009-540599
Patent Literature 7: International Patent Publication No. 2012/108065

BRIEF DESCRIPTION OF THE DRAWINGS

FIG. 3 is a graph showing the spectrum of the white light source of a system according to the present invention corresponding to the spectrum of black-body radiation shown in FIG. 2;

FIG. 4 is a graph showing $(P(\lambda) \times V(\lambda))/(P(\lambda max1) \times V(\lambda max1))$ of the white light source of the system according to the present invention;

FIG. 5 is a graph showing $(B(\lambda) \times V(\lambda))/(B(\lambda max2) \times V(\lambda max2))$ of the black-body radiation shown in FIG. 2;

FIG. 6 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ based on FIGS. 4 and 5;

FIG. 12 is a graph showing $(B(\lambda) \times V(\lambda))/(B(\lambda max2) \times V(\lambda max2))$ of the black-body radiation according to Example 1;

FIG. 13 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 1;

FIG. 16 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 2;

FIG. 17 is a graph showing $(P(\lambda) \times V(\lambda))/(P(\lambda max1) \times V(\lambda max1))$ of a white light source according to Example 3;

FIG. 18 is a graph showing $(B(\lambda) \times V(\lambda))/(B(\lambda max2) \times V(\lambda max2))$ of black-body radiation according to Example 3;

FIG. 19 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 3;

FIG. 20 is a graph showing $(P(\lambda) \times V(\lambda))/(P(\lambda max1) \times V(\lambda max1))$ of a white light source according to Example 4;

FIG. 21 is a graph showing $(B(\lambda) \times V(\lambda))/(B(\lambda max2) \times V(\lambda max2))$ of black-body radiation according to Example 4;

FIG. 22 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 4;

FIG. 23 is a graph showing $(P(\lambda) \times V(\lambda))/(P(\lambda max1) \times V(\lambda max1))$ of a white light source according to Example 5;

FIG. 28 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 6;

FIG. 29 is a graph showing $(P(\lambda) \times V(\lambda))/(P(\lambda max1) \times V(\lambda max1))$ of a white light source according to Comparative Example 1;

FIG. 32 is a graph showing the reproduction region of color temperatures by a white light source system according to Example 7;

FIG. 36 is a graph showing the reproduction region of color temperatures in a white light source system according to Comparative Example 2;

FIG. 41 is a graph showing changes in the color temperature and illuminance of sunbeams in one day of winter in Tokyo, Japan;

FIG. 42 is a graph showing changes in the color temperature and illuminance of sunbeams in one day of winter in Wakkanai, Hokkaido, Japan; and FIG. 43 is a schematic view of a white light source system according to an embodiment.

DETAILED DESCRIPTION

Figure 1:
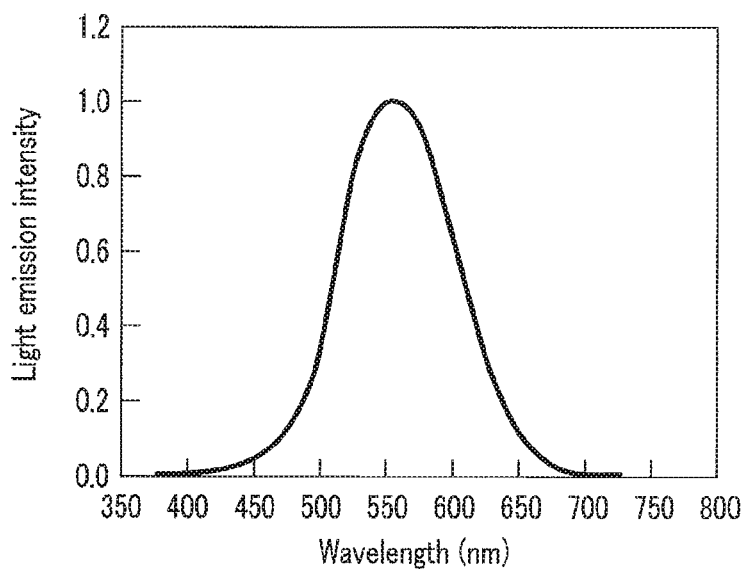
FIG. 1 is a graph showing the spectrum of a spectral luminous efficiency.

In recent years, various white light beams can be obtained using LED light sources, and various attempts to obtain the same illumination effect as sunbeams using an artificial white light source have been made. However, even if the same light emission characteristic as the sunbeams is featured, it is only apparent approximation of the characteristic. From the viewpoint of reproducing sunbeams, the characteristic is insufficient in many cases. For example, patent literature 6 is an invention directed to an artificial sunbeam system, in which the light emission characteristic of sunbeams, which changes depending on the time or location, is reproduced based on a color temperature. However, even if only the color temperature is made to match, the sunbeam reproduction level is not sufficient. This is because to actually reproduce the sunbeams, not only the color temperature but also the wavelength and intensity of each light emission component that forms a specific color temperature need to match. In this point, the artificial sunbeam system of patent literature 6 only reproduce an apparent light emission color, and the reproduction level cannot be said to be sufficient. Patent literature 5 is an invention directed to an illumination system capable of coping with a change in sunbeams in a natural environment. However, even in this invention, the illumination is only controlled with focus on the color temperature and illuminance, and the reproduction level of sunbeams cannot be said to be sufficient.

On the other hand, in patent literatures 3 and 7, sunbeams of different color temperatures are reproduced by the spectrum of black-body radiation having the same color temperature. The sun can be regarded as a kind of black body. Since the spectrum of black-body radiation is also approximated, this is the most excellent method among the cited patent literatures from the viewpoint of reproduction of sunbeams. Additionally, in this invention, a change in the color temperature corresponding to a change in sunbeams in one day can also be reproduced. In this invention, however, although the level of reproduction of the light emission characteristic is satisfactory to some extent, reproduction of a change in the light emission characteristic is insufficient. This is because although white light beams of various kinds of color temperatures can be reproduced, a specific color temperature can only fragmentarily be reproduced, and the color temperature change of sunbeams is not continuously reproduced.

The remaining patent literatures are also the same concerning reproduction of a change in the light emission characteristic. There are several patent literatures in which white light beams of various color temperatures can be reproduced or a change in the light emission color can be reproduced. As for a detailed method, most methods fragmentarily reproduce white light of a specific color temperature. Of these patent literatures, patent literature 5 places focus on the color temperature change of sunbeams and employs an illumination method according to the change. However, this method only switches the color temperature change on a time basis and cannot reproduce a continuous change.

As described above, various inventions have been disclosed as illuminations capable of reproducing the light emission characteristic of sunbeams. However, reproduction of a light emission color or emission spectrum of sunbeams is insufficient, the state of the change in the light emission color or emission spectrum is not continuously reproduced, or only an illumination in which one or both of the above-described characteristics are insufficient is obtained.

It is an object of the present invention to cause a white light source system to reproduce the light emission characteristic of sunbeams whose color temperature and emission spectrum shape change hour by hour and use the white light source system as an illumination in an office or home.

According to the present invention, there is provided a white light source system including a plural of white light sources. An absolute value of a difference between $(P(\lambda) \times V(\lambda))/(P(\lambda max1) \times V(\lambda max1))$ and $(B(\lambda) \times V(\lambda))/(B(\lambda max2) \times V(\lambda max2))$ for each of the white light sources satisfies a relational expression represented by $$|((P(\lambda) \times V(\lambda))/(P(\lambda max1) \times V(\lambda max1)) - (B(\lambda) \times V(\lambda))/(B(\lambda max2) \times V(\lambda max2))| \leq 0.15$$

where the $P(\lambda)$ is an emission spectrum of the each white light source, the $B(\lambda)$ is an emission spectrum of black-body radiation having a color temperature corresponding to the color temperature of the each white light source, the $V(\lambda)$ is a spectrum of a spectral luminous efficiency, the $\lambda max1$ is a wavelength that maximizes $P(\lambda) \times V(\lambda)$, and the $\lambda max2$ is a wavelength that maximizes $B(\lambda) \times V(\lambda)$.

A light emission characteristic of white light emitted by the system is characterized by being continuously changed along with an elapse of time by changing a mixing ratio of light beams from the plural of white light sources. Each of a plural of white light sources included in the white light source system preferably has a general color rendering index of not less than 97. Accordingly, high color rendering properties like natural light can be obtained. More preferably, the general color rendering index of white light emitted by the white light source system is not less than 97.

The white light source used in the white light source system according to the present invention reproduces sunbeams at various color temperatures by combining at least two types of white light sources having different color temperatures and an emission spectrum shape of the same level as the sunbeams. Each white light source used in the present invention includes a light emission component in the visible light region of the sunbeams at the same level as the sunbeams. Mixed white light formed by mixing the white light sources at an arbitrary ratio can also include a light emission component of the same level as the sunbeams.

The white light source system according to the present invention can continuously follow and reproduce a light emission characteristic that changes with time, instead of fragmentarily reproducing white light between different color temperatures. In the present invention, the emission spectrum shape and intensity of a light source are controlled based on data obtained by observing change in sunbeams in one day or one year in advance at various points on the earth. As a result, a time-rate change can be reproduced by the white light source system. Hence, the white light source system according to the present invention can reproduce even a very natural change in sunbeams adapted to the circadian rhythm of a human body without continuously using a white light source of a specific color temperature for a long time or unnaturally artificially adjusting the color temperature or intensity change of the white light source.

The white light source system according to the present invention can obtain natural light very close to the sunbeams and can therefore be used for an application purpose such as a high color rendering illumination. In addition, the white light source system is expected to be applied to the medical field or the like as a vital adaptation illumination that acts on a physiological phenomenon of a human body. For example, if an illumination that adopts a change in the sunbeams in one day or in one year is employed as an illumination used in a medical facility such as a hospital, an effect of appropriately holding the rhythm of the internal clock and promoting rehabilitation of a patient can be expected for a patient who must use an indoor illumination for a long time for hospitalizing. The same effect can be obtained by an illumination for an office or home. It is expected that a modern person who must spend the long daytime indoors can appropriately maintain the internal clock by using the illumination light source of the present invention without going outside.

An embodiment will now be described with reference to the accompanying drawings.

A white light source system according to the embodiment of the present invention includes a plural of white light sources and a controller that controls the plural of white light sources. Each of the plural of white light sources includes an LED module. The white light source system will be described below.

(Light Emission Characteristic of White Light Source)

The white light source used in the system according to the present invention basically reproduces sunbeams of various kinds of color temperatures. That is, when reproducing sunbeams of a specific color temperature, basically, the spectrum of black-body radiation having the same color temperature as the sunbeams is regarded as the emission spectrum by the solar rays, and the shape of the emission spectrum is approximated. The sun can be considered as a kind of black body. The emission spectrum curve of a black body satisfactorily matches the emission spectrum curve of sunbeams. The spectral distribution of actual solar rays is considered to be close to the spectrum of black-body radiation having a color temperature of 5800 K.

However, the color temperature of sunbeams reaching the earth changes hour by hour. This is because the altitude of sunbeams from the earth periodically changes on a daily or yearly basis due to the influence of rotation or revolution of the earth. Air, water, and various kinds of suspended matters exist on the surface of the earth. Hence, until reaching the surface of the earth, the sunbeams passing through the suspended matter layer collide against various kinds of particles, and light beams of specific wavelength components are scattered. At this time, if the solar altitude from the earth changes, the distance of the suspended matter layer that the sunbeams pass through changes, and the appearance of the scattered light changes depending on the angle. For this reason, white light beams of various color temperatures periodically appear. It is normally known that white light of about 2000 to 4000 K appears in the morning or evening when the solar altitude is low, white light of about 5000 to 6000 K appears at noon when the solar altitude is highest, and white light of about 6000 to 7000 K appears in a shade or on a cloudy day.

To reproduce sunbeams of various color temperatures as described above, the white light source used in the system according to the present invention synthesizes an emission spectrum approximated to the spectrum of black-body radiation having a color temperature ranging from 2000 K to 8000 K. This temperature range can almost cover the color temperature range of sunbeams that can be observed on the earth. Note that color temperatures heavily used as illumination light sources have a narrower range from 2000 K to 6500 K.

The above-described spectrum of black-body radiation can be obtained by the Planck's radiation formula represented by $$B(\lambda) = \frac{2hc^2}{\lambda^5} \cdot \frac{1}{e^{hc/\lambda kT} - 1} \tag{1}$$

where h is the Planck constant, k is the Boltzmann constant, c is the velocity of light, and e is the base of a natural logarithm. These are fixed to predetermined numerical values. Hence, if a color temperature T is determined, a spectral distribution $B(\lambda)$ corresponding to each wavelength ($\lambda$) can easily be obtained.

The white light source used in the system according to the present invention is specifically defined as follows. The absolute value of the difference between $(P(\lambda) \times V(\lambda))/(P(\lambda max1) \times V(\lambda max1))$ and $(B(\lambda) \times V(\lambda))/(B(\lambda max2) \times V(\lambda max2))$ satisfies inequality (2) below. The absolute value preferably satisfies inequality (2) below at each wavelength.

$$|((P(\lambda) \times V(\lambda))/(P(\lambda max1) \times V(\lambda max1))-(B(\lambda) \times V(\lambda))/(B(\lambda max2) \times V(\lambda max2))| \leq 0.15 \tag{2}$$

where the $P(\lambda)$ is an emission spectrum of the each white light source, the $B(\lambda)$ is an emission spectrum of black-body radiation having a color temperature corresponding to the color temperature of the each white light source, the $V(\lambda)$ is a spectrum of a spectral luminous efficiency, the $\lambda max1$ is a wavelength that maximizes $P(\lambda) \times V(\lambda)$, and the $\lambda max2$ is a wavelength that maximizes $B(\lambda) \times V(\lambda)$.

$(P(\lambda) \times V(\lambda))$ represents the intensity of the emission spectrum of the white light source in the region of the spectral luminous efficiency $V(\lambda)$. When $(P(\lambda) \times V(\lambda))$ is divided by the maximum value $(P(\lambda max1) \times V(\lambda max1))$, a value whose upper limit is 1.0 can be obtained. $(B(\lambda) \times V(\lambda))$ represents the intensity of the emission spectrum of black-body radiation in the region of the spectral luminous efficiency $V(\lambda)$. When $(B(\lambda) \times V(\lambda))$ is divided by the maximum value $(B(\lambda max2) \times V(\lambda max2))$, a value whose upper limit is 1.0 can be obtained. Next, a difference $A(\lambda) = [(P(\lambda) \times V(\lambda))/(P(\lambda max1) \times V(\lambda max1))-(B(\lambda) \times V(\lambda))/(B(\lambda max2) \times V(\lambda max2))]$ is obtained. If the difference $A(\lambda)$ satisfies $-0.15 \leq A(\lambda) \leq +0.15$, the emission spectrum of the white light source in the region of the spectral luminous efficiency $V(\lambda)$ is approximated to the emission spectrum of the black-body radiation, that is, the emission spectrum of natural light. That is, this means that if difference $A(\lambda)=0$, the same emission spectrum as the natural light can be reproduced.

$$|((P(\lambda) \times V(\lambda))/(P(\lambda max1) \times V(\lambda max1))-(B(\lambda) \times V(\lambda))/(B(\lambda max2) \times V(\lambda max2))| \leq 0.15 \tag{2}$$

Additionally, from the viewpoint of more strictly reproducing the emission spectrum of the black-body radiation, the white light source used in the system according to the present invention preferably satisfies $$|((P(\lambda) \times V(\lambda))/(P(\lambda max1) \times V(\lambda max1))-(B(\lambda) \times V(\lambda))/(B(\lambda max2) \times V(\lambda max2))| \leq 0.10 \tag{3}$$

The above definitions will be described in more detail with reference to the accompanying drawings. FIG. 1 is a graph showing the spectrum of the spectral luminous efficiency. This is a spectral distribution corresponding to the sensitivity of the human eye, which exhibits a bilaterally symmetrical spectral distribution having the maximum sensitivity at about 555 nm, as can be seen.

Figure 2:
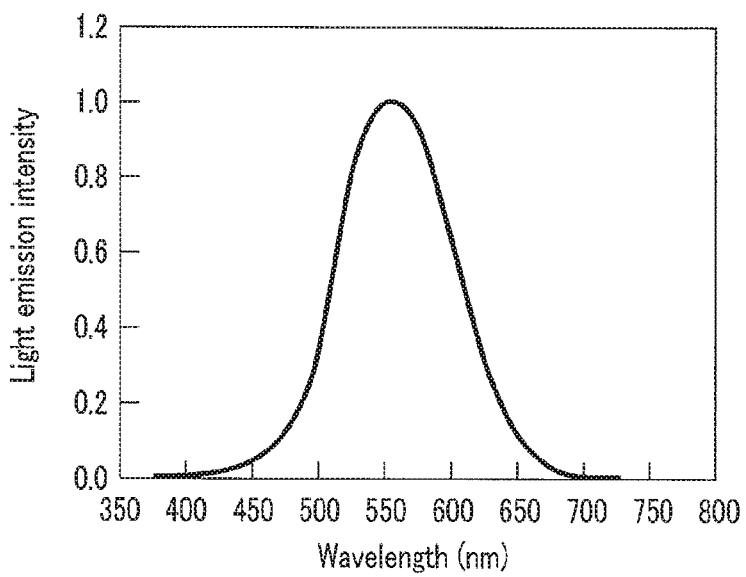
FIG. 2 is a graph showing the spectrum of black-body radiation having a color temperature of 5100 K.

FIG. 2 shows the spectrum of black-body radiation corresponding to sunbeams having a color temperature of 5100 K. FIG. 3 shows the emission spectrum of the white light source used in the system according to the present invention, which is approximated to the spectrum of black-body radiation of 5100 K. As is apparent from comparison of the spectra, the two emission spectrum shapes satisfactorily match in a wavelength region from 450 nm to 650 nm. At a wavelength less than 450 nm or more than 650 nm, the two spectral distributions are largely different. However, these wavelength ranges can hardly be sensed by the human eye, as is apparent from FIG. 1, and can be neglected almost without any problem. Note that the emission spectrum of the light source used in the system according to the present invention includes, for example, the emission spectrum shown in FIG. 3. The emission spectrum shown in FIG. 3 is the combination of the emission spectrum of a light emitting diode (LED) and the emission spectrum of a phosphor, as will be described later. The spectrum shape can be approximated to that of black-body radiation by appropriately adjusting the mixture of the emission spectra of three or more types of phosphors.

FIGS. 4 and 5 show spectra obtained by multiplying the emission spectra shown in FIGS. 2 and 3 by the spectral luminous efficiency. The spectrum shown in FIG. 4 shows an emission spectrum represented by $(P(\lambda) \times V(\lambda))/(P(\lambda max1) \times V(\lambda max1))$ of the white light source used in the system according to the present invention. FIG. 5 shows an emission spectrum represented by $(B(\lambda) \times V(\lambda))/(B(\lambda max2) \times V(\lambda max2))$ of the black-body radiation. FIG. 6 shows the differential spectrum between the spectral distributions shown in FIGS. 4 and 5. More specifically, the differential spectrum is represented by an expression $(P(\lambda) \times V(\lambda))/(P(\lambda max1) \times V(\lambda max1))-(B(\lambda) \times V(\lambda))/(B(\lambda max2) \times V(\lambda max2))$. As can be seen from the differential spectrum shown in FIG. 6, the absolute value of the difference between the spectra is 0.05 or less at each wavelength within the range of 350 nm to 800 nm, and satisfies a relation represented by $$|((P(\lambda) \times V(\lambda))/(P(\lambda max1) \times V(\lambda max1)) - (B(\lambda) \times V(\lambda))/(B(\lambda max2) \times V(\lambda max2)))| \leq 0.10 \quad (3)$$

(LED Module)

The white light source used in the system according to the present invention includes an LED module. The LED module preferably includes a light emitting diode (LED) and a phosphor. The phosphor preferably absorbs primary light emitted by the LED and converts it into secondary light. At this time, when several materials that exhibit various light emission colors in the visible light range are prepared as phosphor materials and arbitrarily combined, white light beams of various color temperatures can be obtained.

An LED having light emission peak wavelength in the ultraviolet to violet region is preferably used. More specifically, the light emission peak wavelength preferably falls within the range of 350 to 420 nm. In a case in which an LED having a light emission peak wavelength more than 420 nm is used, since the LED exhibits sharp light emission at a specific wavelength in the visible light range, the balance between the light emission of the LED and light emission of a phosphor generally having a broad spectrum shape is poor, and it is difficult to satisfy the relation of inequality (2) or (3) described above. Additionally, if the LED emits blue light, the blue light is excessively included. This is not suitable in terms of the influence on human bodies.

The LED that emits light in the ultraviolet or violet region has a low spectral luminous efficiency and can reduce the influence on white light. In addition, ultraviolet light can be eliminated by cutting primary light (ultraviolet or violet light emission) from the LED so the primary light is not emitted from the white light source system. Note that as for the type of LED, any condition other than the light emission peak wavelength is not particularly limited. An LED of laser emission type may be used, and the LED may use any material.

To cause the emission spectrum of the white light source to satisfy the relation of inequality (2) or (3), three or more types or, if possible, four or more types of phosphors out of a blue phosphor, a green phosphor, a yellow phosphor, and a red phosphor are preferably used as the phosphors to be combined with the LED. When the phosphors are arbitrarily combined in accordance with the corresponding spectrum of the black-body radiation, white light emission having an arbitrary color temperature can be obtained. As for a detailed mixing ratio, the blue light emitting phosphor is mixed at a ratio of 45 parts by weight to 75 parts by weight, the green light emitting phosphor is mixed at a ratio of 3 parts by weight to 7 parts by weight, the yellow light emitting phosphor is mixed at a ratio of 9 parts by weight to 17 parts by weight, and the red phosphor is mixed at a ratio of 9 parts by weight to 18 parts. The mixing ratio is adjusted such that the total amount of the phosphors becomes 100 parts by weight, thereby obtaining a mixed phosphor for white light emission. Detailed types of phosphors to be used are not particularly limited as long as the light emission peak is 420 to 700 nm. The following materials are preferably used as the phosphors to be excited at 350 to 420 nm.

Examples of the blue phosphor include a europium activated alkaline earth phosphate phosphor $M_{10}(PO_4)_6Cl_2$:Eu, where M is at least one element selected from the group consisting of Sr, Ba, Ca, and Mg) having a light emission peak wavelength of 440 to 455 nm, a europium activated magnesium aluminate phosphor ($NMgAl_{10}O_{17}$:Eu, where N is at least one element selected from the group consisting of Sr and Ba) having a light emission peak wavelength of 450 to 460 nm, a europium activated alkaline earth aluminate blue phosphor having a peak wavelength of 450 nm, and a europium activated aluminate blue phosphor having a peak wavelength of 452 nm.

Examples of the green phosphor include a europium and manganese activated orthosilicate phosphor ((Sr, Ba, Mg)$_2$SiO$_4$:Eu, Mn) having a light emission peak wavelength of 520 to 550 nm, a europium activated β sialon phosphor ($Si_{6-z}Al_zO_zN_{8-z}$:Eu, and, for example, $Si_4Al_2O_2N_6$:Eu) having a light emission peak wavelength of 535 to 545 nm, a europium activated strontium sialon phosphor ($Sr_{3-x}Eu_xSi_{13}Al_3O_2N_{21}$, where x is 0.03 to 0.30, and particularly, x=0.2 is preferable) having a light emission peak wavelength of 520 to 540 nm, a europium activated orthosilicate green phosphor having a peak wavelength of 530 nm, and a europium and manganese activated alkaline earth magnesium silicate green phosphor.

Examples of the yellow phosphor include a europium and manganese activated orthosilicate phosphor ((Sr, Ba, Mg)$_2$SiO$_4$:Eu, Mn) having a light emission peak wavelength of 550 to 580 nm, a cerium activated rare earth aluminum garnet phosphor ($Y_3Al_5O_{12}$:Ce) having a light emission peak wavelength of 550 to 580 nm, a cerium activated rare earth magnesium silicon containing garnet phosphor ($Y_3$(Al, (Mg, Si))$_5O_{12}$:Ce) having a light emission peak wavelength of 550 to 580 nm, a cerium activated strontium sialon phosphor ($Sr_{2-x}Ce_xSi_7Al_3ON_{13}$, where x is 0.04 to 0.10, and particularly, x=0.05 is preferable) having a light emission peak wavelength of 550 to 580 nm, a europium activated orthosilicate yellow phosphor having a peak wavelength of 555 nm, and a europium and manganese activated alkaline earth magnesium silicate yellow phosphor.

Examples of the red phosphor include a europium activated strontium sialon phosphor ($Sr_{2-x}Eu_xSi_7Al_3ON_{13}$, where x is 0.02 to 0.10, and particularly, x=0.05 is preferable) having a light emission peak wavelength of 600 to 630 nm, a europium activated calcium nitridoaluminosilicate phosphor ($CaAlSiN_3$:Eu) having a light emission peak wavelength of 620 to 660 nm, and a europium activated alkaline earth nitridoaluminosilicate phosphor ($MAlSiN_3$:Eu, where M is at least one element selected from the group consisting of Ca, Sr, and Ba) having a light emission peak wavelength of 620 to 660 nm.

A phosphor is preferably mixed with a resin material and used in a form of a phosphor film. When the periphery of an LED chip is directly or indirectly coated with the phosphor film, primary light emitted by the LED is converted into secondary light (white light) by the phosphor film and radiated out of the light source. The resin material to be used is not particularly limited as long as it is a transparent material. If an LED that emits light in the ultraviolet or violet region is used as the LED, silicone resin or the like is preferably used. The silicone resin or the like can have an excellent deterioration resistance characteristic to ultraviolet rays.

The white light source used in the system according to the present invention preferably obtains white light emission by combining phosphor light emissions. The phosphor preferably absorbs the energy of primary light from the LED as much as possible. At the same time, the LED light needs to be avoided from leaking out of the light source. In particular, if the LED light includes ultraviolet rays, they may damage the skin or eyes of a human body and are therefore preferably removed as much as possible.

The LED module used in the system according to the present invention can be a module including an LED element and a phosphor film that covers the light emitting surface of the LED element. To prevent the leakage of ultraviolet rays in a case in which an LED element that emits ultraviolet light or violet light is used, the phosphor is preferably formed to be sufficiently thick. If the phosphor film is made thick, LED light reflected by the surface of each phosphor particle can be prevented from leaking out of the light source via the phosphor film. At this time, if the phosphor film is excessively thick, light emitted by the phosphor itself cannot be output from the phosphor film, and the light emission intensity of the phosphor film lowers. In general, the particle size of the phosphor and the maximum film thickness are known to hold a proportional relationship. As for the phosphor film, it is preferable to use a phosphor whose particle size is as large as possible for practical use and make the phosphor film as thick as possible. For this purpose, the phosphor used in the LED module is preferably made of particles whose average particle size ranges from 10 μm to 40 μm. The phosphor film containing the particles of the phosphor having the average particle size preferably has a thickness of 100 μm to 1000 μm. In this way, an LED module that prevents a decrease in light emission of the phosphor film as much as possible and suppresses the leakage of ultraviolet rays as much as possible can be obtained. Artificial sunbeams with little influence of ultraviolet rays can thus be obtained.

Additionally, to make sure that the leakage of ultraviolet rays is prevented, an ultraviolet ray absorbing film may be formed outside the phosphor film. In this case, a fine particle white pigment such as zinc oxide, titanium oxide, or aluminum oxide can be used as an ultraviolet ray absorbent/reflective material. The fine particle pigment is dispersed in a resin, like the phosphor film, and, using this, an ultraviolet ray absorbent film is directly or indirectly formed outside the phosphor film, thereby obtaining the target LED module. The LED module obtained in this way can reduce the amount of ultraviolet light leaked out of the module to 0.4 mW/lm or less.

The numerical value of the ultraviolet light can be obtained by the following method. Let $P(\lambda)$ be the emission spectrum of white light emitted by the white light source, and $V(\lambda)$ be the spectrum of the spectral luminous efficiency. The spectra are multiplied and integrated to obtain $\phi$. In equation (4), 683 is a constant that satisfies 1 W=683 Lm at a wavelength of 555 nm.

$$\phi = 683 \cdot \int P(\lambda) \cdot V(\lambda) d\lambda \quad (4)$$

The energy of primary light emitted by the LED can be obtained by obtaining UV by integrating a spectrum $F(\lambda)$ within the range of 350 to 420 nm in accordance with equation (5).

$$UV = \int_{350}^{420} P(\lambda) d\lambda \quad (5)$$

Primary light energy per luminous flux of light emitted by the white light source can be obtained by $UV/\phi$.

(Light Emission Characteristic of White Light Source System)

The white light source system according to the present invention includes a plural of white light sources having difference color temperatures in one system. By appropriately mixing the light emissions of the plural of white light sources having different color temperatures, white light beams having various color temperatures can be reproduced. At this time, a visible light emission component included in each white light source has almost the same type and intensity as solar rays. White light of an intermediate color temperature obtained by mixing the plural of white light sources also has the same light emission characteristic as the sunbeams. Hence, all white light beams obtained by the white light source system according to the present invention are white light beams that satisfy above-described relational expression (2), and preferably, (3).

Figure 7:
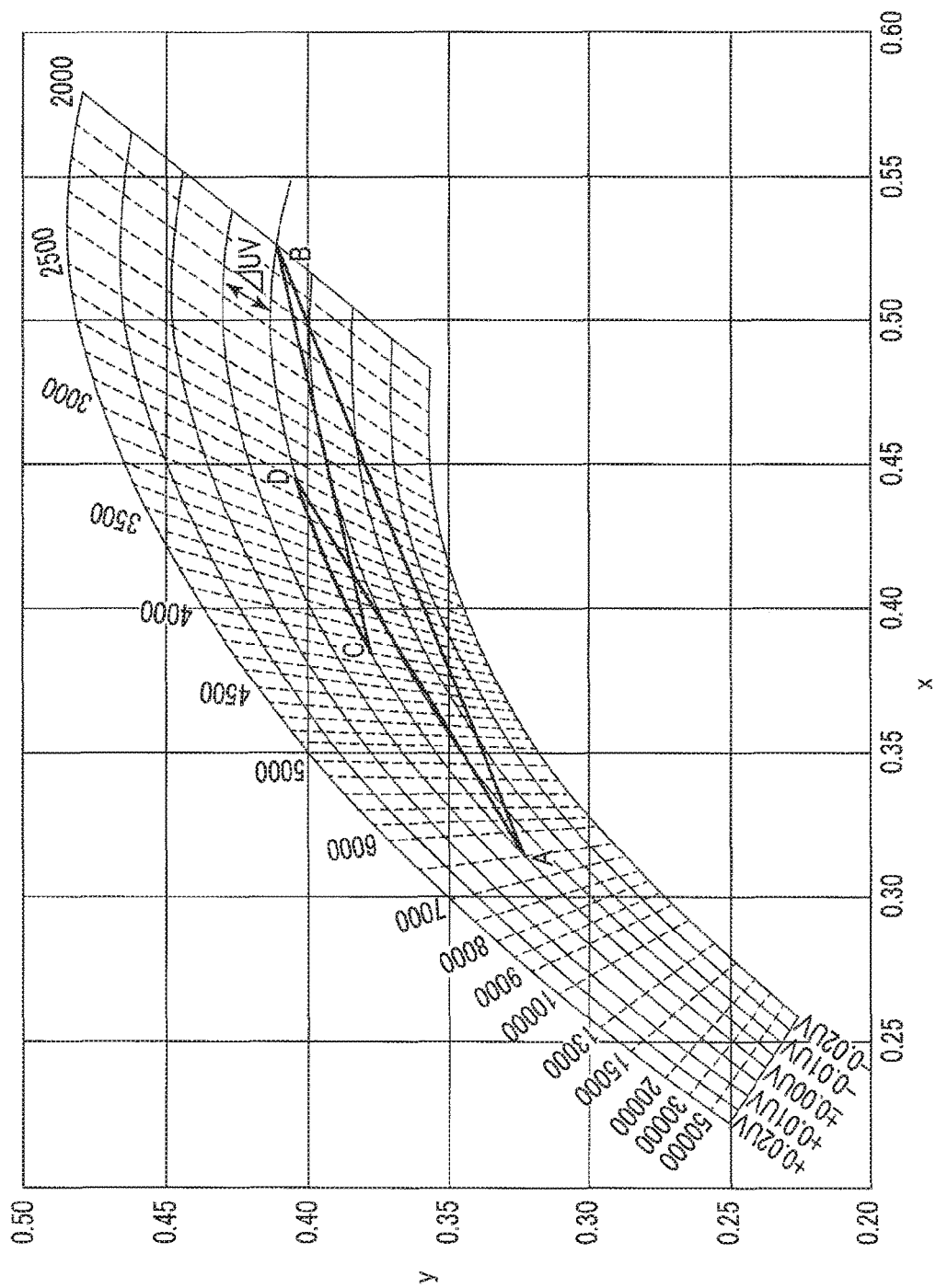
FIG. 7 is a graph showing the reproduction region of color temperatures by the white light source system according to the present invention.

On the other hand, the color temperature of white light obtained by mixing light emissions of the plural of white light sources can be obtained as shown in FIG. 7. For example, a white light source system including three white light sources configured to exhibit white light emissions whose color temperatures on a black body locus are 6500 K (a point A in FIG. 7) and 2000 K (a point B in FIG. 7) at two points and an intermediate color temperature (a point C or D in FIG. 7) between them is constituted. At this time, in a case in which only two types of white light sources are used, for example, in a case in which white light of 6500 K and white light of 2000 K are used, if they are mixed at an arbitrary ratio, only white light having an arbitrary color temperature on the line that connects the point A and the point B in FIG. 7 can be obtained. Hence, as is apparent from the line AB in FIG. 7, the color temperature of obtained white light largely deviates from the black body locus and may exceed −0.01 duv. For example, at a color temperature of 3200 K, the deviation is −0.013 duv, which exceeds −0.01 duv. In the white light source system according to the present invention, to prevent the color temperature of mixed white light largely deviating from a point of the black body locus, mixed white is obtained using at least three types of white light sources. For example, in a case in which a white light source of 4100 K of an intermediate color temperature is additionally used, if this light source and a white light source having a color temperature of 2000 K are mixed at an arbitrary ratio, arbitrary white light on the line BC in FIG. 7 can be obtained. The deviation from the black-body radiation can be suppressed within the range of 0 to −0.005 duv. Additionally, in a case in which a white light source having a color temperature of, for example, 2950 K is used as a white light source of an intermediate color temperature, if this light source and a white light source having a color temperature of 6500 K are mixed at an arbitrary ratio, arbitrary white light on the line AD in FIG. 7 can be obtained. The deviation from the black-body radiation can be reduced to the range of 0 to −0.005 duv, as in the above-described case. Hence, when a white light having one of color temperatures within the range of 2950 K to 4100 K is selected as a third white light source in addition to the white light source having a color temperature of 2000 K and the white light source having a color temperature of 6500 K, white light which has an arbitrary color temperature within the range of 2000 K to 6500 K and whose absolute value of the deviation from the black body locus is 0.005 duv or less can be obtained.

The white light sources to be combined to obtain white light which has a color temperature within the range of 2000 K to 6500 K and whose absolute value of the deviation from the black body locus is 0.005 duv or less is not limited to the above-described first to third white light sources. Two types of white light sources in the descending order or ascending order of color temperature are selected from three or more types of white light sources, which satisfy the relational expression (2) and have different color temperatures, and mixed, thereby obtaining white light whose color temperature and deviation satisfy the above-described ranges.

The number of the plural white light sources used in the white light source system needs to be at least three. From the viewpoint of light emission characteristic, in particular, accurately reproducing a color temperature on the locus of black-body radiation, the number of white light sources is preferably as large as possible. Especially, when the range of color temperatures to be reproduced by the white light source system is wide, for example, when reproducing white light having a color temperature of 2000 K to 8000 K, at least four types of white light sources are preferably used. However, if the number of types of white light sources is too large, a control circuit configured to control the light emission intensity of each white light source or the system configurator of the apparatus becomes complex, and therefore, restrictions exist, although an excellent color temperature reproduction characteristic can be obtained. As for the most efficient number of white light sources to be used, the number of types of white light sources is preferably three or four within the range of color temperatures to be reproduced by the white light source system according to the present invention.

(Time-Rate Change of Light Emission Characteristic)

The white light source system according to the present invention can reproduce a one-day change in white light represented by sunbeams from sunrise to sunset in a specific region on the earth in accordance with the season. The white light source system according to the present invention can express a one-day change in sunbeams as a continuous change very natural to the human eye. To reproduce such a change, in the present invention, the system controls the light emission characteristic using the data obtained by actually measuring the one-day change in sunbeams at main points on the earth.

Figure 8:
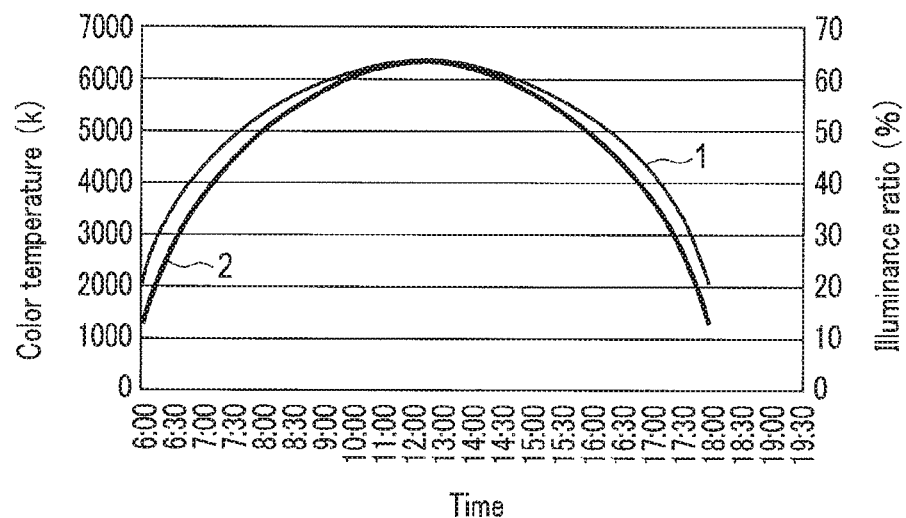
FIG. 8 is a graph showing changes in the color temperature and illuminance of sunbeams in one day of spring in Tokyo, Japan.

According to a result derived by David Lewis MacAdam from visual color-matching experiments (Color Engineering, 2nd edition, Tokyo Denki University Press), the standard deviation of discrimination variations from a specific center color can be represented on an xy chromaticity diagram as the range of a shape called a "MacAdam ellipse", and it was found that the human could discriminate colors in the range three times the standard deviation. According to the findings, when calculations were done for white light of 5000 K, a value of 330K (4850 K to 5180 K) was obtained as a discriminable threshold. For example, for white light of 5000 K, the human eye cannot discriminate a color temperature difference of about 330 K or less FIG. 8 is a graph showing a color temperature change and an illuminance change in sunbeams from 6:00 a.m. to 6:00 p.m. in one day of spring in Tokyo located at latitude 35° north. In FIG. 8, a graph indicated by reference numeral 1 represents the color temperature change, and a graph indicated by reference numeral 2 represents the illuminance change. This graph was created based on a result obtained by actually measuring the time-rate change of sunbeams every three minutes. The measurement was performed using MP350 available from UPRtek, and data were obtained using kelvin (K) as a unit for color temperature and lux (lx) for illuminance. Note that an illuminance in a graph is expressed as an illuminance ratio (%) obtained by relative comparison with a specific value as a reference. In addition, since the color temperature of sunbeams changes in one day at a rate of about 200 K every three minutes, the difference in color temperature in the measurement unit of the present invention cannot be discriminated by the human eye. Hence, even if the color temperature change is reproduced using the measurement data, the moment the color temperature of the light source changes cannot be recognized, and the change can be accepted in a natural form as if it were a continuous change.

FIG. 43 shows an example of the white light source system according to an embodiment. As shown in FIG. 43, the white light source system according to the embodiment includes a white light source unit 21 and a controller 22. The white light source unit 21 includes a substrate 23, a plural of white light sources 24 arranged on the substrate 23, and a light emitting device cover 25 fixed to the substrate 23 to cover the plural of white light sources. Each of the plural of white light sources 24 is formed from an LED module. The LED module includes an LED chip 26 arranged on the substrate 23, and a phosphor film 27 that is arranged on the substrate 23 and covers the LED chip 26. The substrate 23 is provided with a wiring network. The electrode of each LED chip 26 is electrically connected to the wiring network of the substrate 23.

The controller 22 includes a control unit 28, a memory unit 29, and a data input/output unit 30. Each white light source 24 formed by an LED module is connected to an electronic circuit (not shown) of the control unit 28 via a wiring line 31. The white light source 24 emits light by a current that flows from the control unit 28 via the wiring line 31. The electronic circuit memory unit 29 of the control unit 28 stores change data of sunbeams in one day for each location and each season (period). To obtain an illumination light source of a desired pattern, a system user inputs location information such as a city name or latitude/longitude and time information such as a season to the data input/output unit 30, and obtained data are sent to the control unit 28. The control unit 28 extracts storage data corresponding to the input data, reads the data of the color temperature and illuminance of sunbeams for in a specific location and season, and based on these data, calculates the mixing intensity ratio of each white light source. Based on the calculation result, the electronic circuit of the control unit 28 controls the value of a current to be applied to each white light source 24, and reproduces a necessary characteristic change of sunbeams.

In the present invention, the change in the light emission characteristic of sunbeams shown in FIG. 8 is reproduced by a method of combining a plural of white light sources approximated to sunbeams in accordance with detailed methods shown in examples.

EXAMPLES

The white light source system according to the present invention will be described below in detail using examples.

Example 1

White light source 1 used in the system according to the present invention was manufactured.

A white light source was manufactured by combining four types of phosphors, that is, a blue phosphor, a green phosphor, a yellow phosphor, and a red phosphor, and an LED. As the LED, an LED having a light emission peak at 395 nm and configured to emit violet or ultraviolet light was used. As the phosphors, a europium activated alkaline earth phosphate blue phosphor having a peak wavelength of 445 nm, a europium activated orthosilicate green phosphor having a peak wavelength of 530 nm, a europium activated orthosilicate yellow phosphor having a peak wavelength of 555 nm, and a europium activated calcium nitridoaluminosilicate phosphor ($CaAlSiN_3$:Eu) having a peak wavelength of 650 nm were prepared. The phosphors were mixed at a weight ratio of blue phosphor:green phosphor:yellow phosphor:red phosphor=58:6:15:21. A powder having an average particle size of 30 to 35 μm was used for each phosphor. A phosphor slurry prepared by dispersing phosphor particles in a silicone resin was applied to cover an LED chip placed on a substrate, thereby manufacturing an LED module. The film thickness of phosphor film was about 780 μm.

Figure 9:
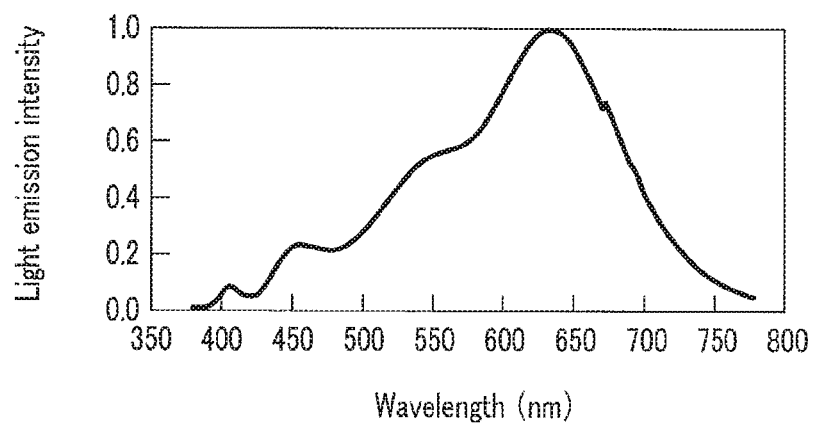
FIG. 9 is a graph showing the emission spectrum of a white light source according to Example 1.
Figure 10:
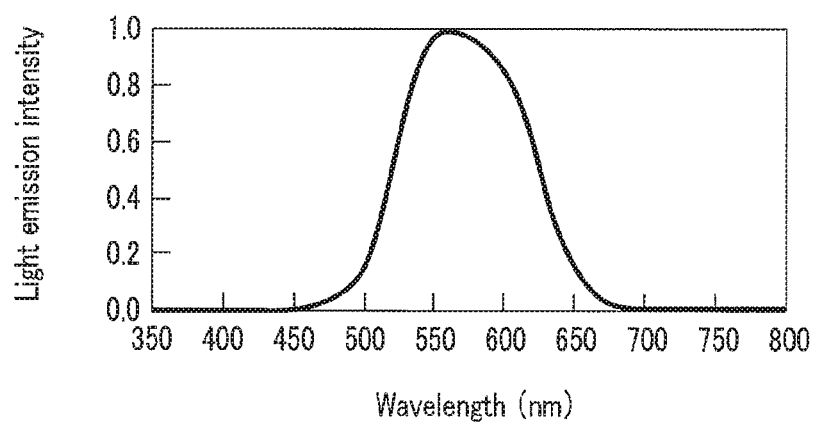
FIG. 10 is a graph showing $(P(\lambda) \times V(\lambda))/(P(\lambda max1) \times V(\lambda max1))$ of the white light source according to Example 1.
Figure 11:
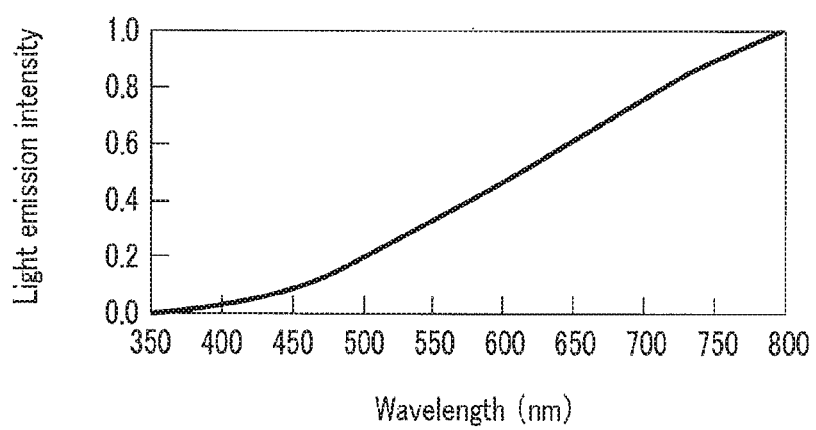
FIG. 11 is a graph showing the emission spectrum of black-body radiation according to Example 1.

Next, the light emission characteristic of each LED module was measured using a total flux measuring instrument including an integrating sphere complying with JIS-C-8152. The color temperature of the white light source was 2074 K, and the emission spectral distribution was as shown in FIG. 9. FIG. 10 shows $(P(\lambda) \times V(\lambda))/(P(\lambda max1) \times V(\lambda max1))$ of Example 1 which was obtained using a spectral luminous efficiency $V(\lambda)$ shown in FIG. 1. On the other hand, the spectrum of black-body radiation having a corresponding color temperature of 2074 K was as shown in FIG. 11. When $(B(\lambda) \times V(\lambda))/(B(\lambda max2) \times V(\lambda max2))$ was obtained in a similar manner, a curve shown in FIG. 12 was obtained. As a differential spectrum between FIGS. 10 and 12 and represented by $(P(\lambda) \times V(\lambda))/(P(\lambda max1) \times V(\lambda max1))-(B(\lambda) \times V(\lambda))/(B(\lambda max2) \times V(\lambda max2))$, a curve shown in FIG. 13 was obtained. As is apparent from the curve shown in FIG. 13, the differential spectrum was distributed within the range of −0.04 to +0.10. It was found that the relation of inequality (2) given by $$|((P(\lambda) \times V(\lambda))/(P(\lambda max1) \times V(\lambda max1))-(B(\lambda) \times V(\lambda))/(B(\lambda max2) \times V(\lambda max2)))| \leq 0.15 \quad (2)$$

was satisfied at each wavelength within the range of 350 nm to 800 nm.

A reflector, a cover, and as needed, a lens, and the like were attached to the LED module, and an electronic circuit was also connected to form the white light source used in the system according to the present invention. The luminous efficiency of the white light source was 65 lm/W. The intensity of LED primary light leaked from the white light source was 0.12 mW/lm, and it was found that the intensity of leaked ultraviolet rays was not problematic. A general color rendering index Ra of the white light source was 97.

Example 2

White light source 2 used in the system according to the present invention was manufactured.

A white light source was manufactured by combining four types of phosphors, that is, a blue phosphor, a green phosphor, a yellow phosphor, and a red phosphor, and an LED. As the LED, an LED having a light emission peak at 410 nm and configured to emit violet or ultraviolet light was used. As the phosphors, a europium activated alkaline earth aluminate blue phosphor having a peak wavelength of 450 nm, a europium activated orthosilicate green phosphor having a peak wavelength of 541 nm, a europium activated orthosilicate yellow phosphor having a peak wavelength of 565 nm, and a europium activated calcium nitridoaluminosilicate phosphor (CaAlSiN$_3$:Eu) having a peak wavelength of 650 nm were prepared. The phosphors were mixed at a weight ratio of blue phosphor:green phosphor:yellow phosphor:red phosphor=62:3:17:18. A powder having an average particle size of 35 to 40 μm was used for each phosphor. A phosphor slurry prepared by dispersing phosphor particles in a silicone resin was applied to cover an LED chip placed on a substrate, thereby manufacturing an LED module. The film thickness of phosphor film was about 850 μm.

Figure 14:
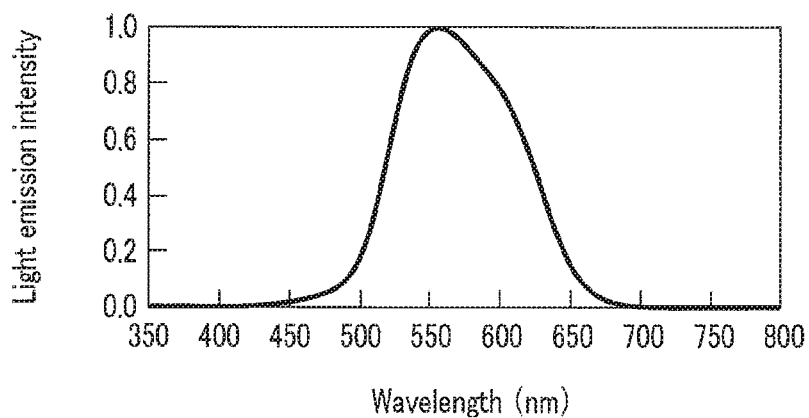
FIG. 14 is a graph showing $(P(\lambda) \times V(\lambda))/(P(\lambda max1) \times V(\lambda max1))$ of a white light source according to Example 2.
Figure 15:
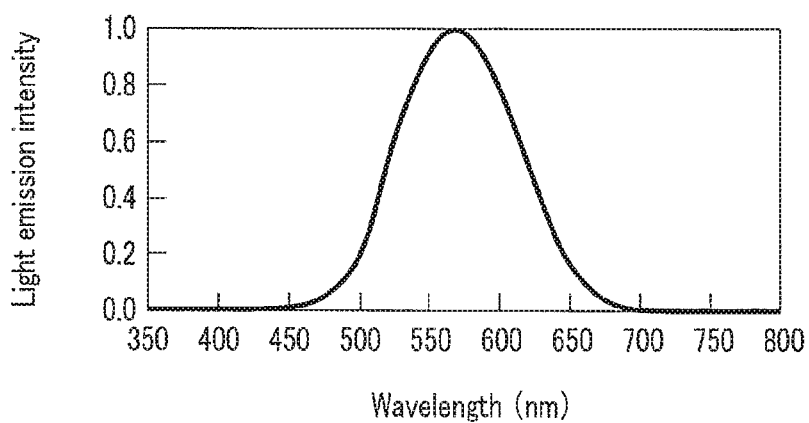
FIG. 15 is a graph showing $(B(\lambda) \times V(\lambda))/(B(\lambda max2) \times V(\lambda max2))$ of black-body radiation according to Example 2.

The color temperature of the obtained white light source was 3077 K, and the emission spectrum characteristic $(P(\lambda) \times V(\lambda))/(P(\lambda max1) \times V(\lambda max1))$ was as shown in FIG. 14. A curve obtained by $(B(\lambda) \times V(\lambda))/(B(\lambda max2) \times V(\lambda max2))$ for the spectrum of black-body radiation having a corresponding color temperature of 3077 K, was as shown in FIG. 15. A differential spectrum between FIGS. 14 and 15 and represented by $(P(\lambda) \times V(\lambda))/(P(\lambda max1) \times V(\lambda max1))-(B(\lambda) \times V(\lambda))/(B(\lambda max2) \times V(\lambda max2))$ was as shown in FIG. 16. As is apparent from the curve shown in FIG. 16, the differential spectrum was distributed within the range of −0.06 to +0.09. It was found that the relation of inequality (2) was satisfied at each wavelength within the range of 350 nm to 800 nm.

A reflector, a lens, a cover, and the like were attached to the LED module, and an electronic circuit was also connected to form the white light source used in the system according to the present invention. The luminous efficiency of the white light source was 66 lm/W. The intensity of LED primary light leaked from the white light source was 0.09 mW/lm, and it was found that the intensity of leaked ultraviolet rays was not problematic. A general color rendering index Ra of the white light source was 97.

Example 3

White light source 3 used in the system according to the present invention was manufactured.

A white light source was manufactured by combining four types of phosphors, that is, a blue phosphor, a green phosphor, a yellow phosphor, and a red phosphor, and an LED. As the LED, an LED having a light emission peak at 420 nm and configured to emit violet or ultraviolet light was used. As the phosphors, a europium activated alkaline earth phosphate blue phosphor having a peak wavelength of 452 nm, a europium activated orthosilicate green phosphor having a peak wavelength of 530 nm, a cerium activated rare earth magnesium silicon containing garnet phosphor having a peak wavelength of 560 nm, and a europium activated strontium sialon phosphor having a peak wavelength of 629 nm were prepared. The phosphors were mixed at a weight ratio of blue phosphor:green phosphor:yellow phosphor:red phosphor=65:6:14:15. A powder having an average particle size of 20 to 30 μm was used for each phosphor. A phosphor slurry prepared by dispersing phosphor particles in a silicone resin was applied to cover an LED chip placed on a substrate, thereby manufacturing an LED module. The film thickness of phosphor film was about 705 μm.

The color temperature of the obtained white light source was 4029 K, and the emission spectrum characteristic $(P(\lambda) \times V(\lambda))/(P(\lambda max1) \times V(\lambda max1))$ was as shown in FIG. 17. A curve obtained by $(B(\lambda) \times V(\lambda))/(B(\lambda max2) \times V(\lambda max2))$ in the spectrum of black-body radiation having a corresponding color temperature of 4029 K, was shown in FIG. 18. A differential spectrum $(P(\lambda) \times V(\lambda))/(P(\lambda max1) \times V(\lambda max1))-(B(\lambda) \times V(\lambda))/(B(\lambda max2) \times V(\lambda max2))$ between FIGS. 17 and 18 was as shown in FIG. 19. As is apparent from the curve shown in FIG. 19, the differential spectrum was distributed within the range of −0.08 to +0.05. It was found that the relation of inequality (2) was satisfied at each wavelength within the range of 350 nm to 800 nm.

A reflector, a lens, a cover, and the like were attached to the LED module, and an electronic circuit was also connected to form the white light source used in the system according to the present invention. The luminous efficiency of the white light source was 63 lm/W. The intensity of LED primary light leaked from the white light source was 0.21 mW/lm, and it was found that the intensity of leaked ultraviolet rays was not problematic. A general color rendering index Ra of the white light source was 98.

Example 4

White light source 4 used in the system according to the present invention was manufactured.

A white light source was manufactured by combining four types of phosphors, that is, a blue phosphor, a green phosphor, a yellow phosphor, and a red phosphor, and an LED. As the LED, an LED having a light emission peak at 415 nm and configured to emit violet or ultraviolet light was used. As the phosphors, a europium activated aluminate blue phosphor having a peak wavelength of 452 nm, a europium activated β sialon phosphor having a peak wavelength of 537 nm, a cerium activated rare earth aluminum garnet phosphor having a peak wavelength of 572 nm, and a europium activated alkaline earth nitridoaluminosilicate phosphor having a peak wavelength of 640 nm were prepared. The phosphors were mixed at a weight ratio of blue phosphor:green phosphor:yellow phosphor:red phosphor=71:7:9:13. A powder having an average particle size of 15 to 25 μm was used for each phosphor. A phosphor slurry prepared by dispersing phosphor particles in a silicone resin was applied to cover an LED chip placed on a substrate, thereby manufacturing an LED module. The film thickness of phosphor film was about 660 μm.

The color temperature of the obtained white light source was 5085 K, and the emission spectrum characteristic $(P(\lambda) \times V(\lambda))/(P(\lambda max1) \times V(\lambda max1))$ was as shown in FIG. 20. A curve obtained by $(B(\lambda) \times V(\lambda))/(B(\lambda max2) \times V(\lambda max2))$ in the spectrum of black-body radiation having a corresponding color temperature of 5085 K, was shown in FIG. 21. A differential spectrum $(P(\lambda) \times V(\lambda))/(P(\lambda max1) \times V(\lambda max1)) - (B(\lambda) \times V(\lambda))/(B(\lambda max2) \times V(\lambda max2))$ between FIGS. 20 and 21 was as shown in FIG. 22. As is apparent from the curve shown in FIG. 22, the differential spectrum was distributed within the range of −0.10 to +0.025. It was found that the relation of inequality (2) was satisfied at each wavelength within the range of 350 nm to 800 nm.

A reflector, a lens, a cover, and the like were attached to the LED module, and an electronic circuit was also connected to form the white light source used in the system according to the present invention. The luminous efficiency of the white light source was 63 lm/W. The intensity of LED primary light leaked from the white light source was 0.24 mW/lm, and it was found that the intensity of leaked ultraviolet rays was not problematic. A general color rendering index Ra of the white light source was 97.

Example 5

White light source 5 used in the system according to the present invention was manufactured.

A white light source was manufactured by combining four types of phosphors, that is, a blue phosphor, a green phosphor, a yellow phosphor, and a red phosphor, and an LED. As the LED, an LED having a light emission peak at 410 nm and configured to emit violet or ultraviolet light was used. As the phosphors, a europium activated alkaline earth phosphate phosphor having a peak wavelength of 440 to 455 nm, a europium activated strontium sialon phosphor having a peak wavelength of 525 nm, a europium activated strontium sialon phosphor having a peak wavelength of 575 nm, and a europium activated alkaline earth nitridoaluminosilicate phosphor having a peak wavelength of 640 nm were prepared. The phosphors were mixed at a weight ratio of blue phosphor:green phosphor:yellow phosphor:red phosphor=75:6:9:10. A powder having an average particle size of 40 to 45 μm was used for each phosphor. A phosphor slurry prepared by dispersing phosphor particles in a silicone resin was applied to cover an LED chip placed on a substrate, thereby manufacturing an LED module. The film thickness of phosphor film was about 850 μm.

Figure 24:
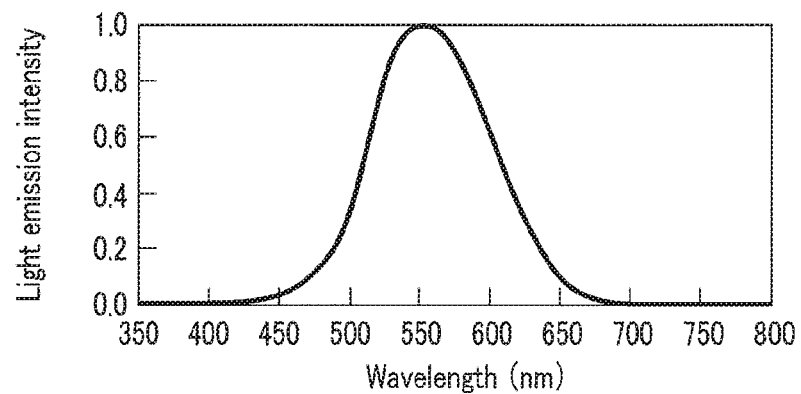
FIG. 24 is a graph showing $(B(\lambda) \times V(\lambda))/(B(\lambda max2) \times V(\lambda max2))$ of black-body radiation according to Example 5.
Figure 25:
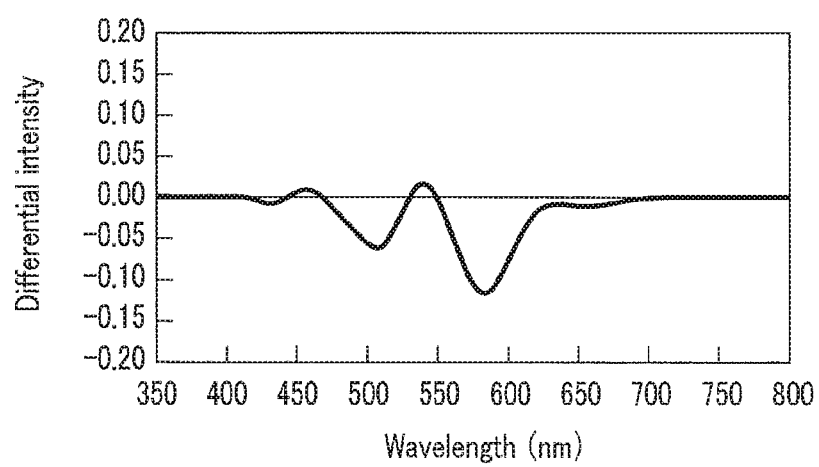
FIG. 25 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ according to Example 5.

The color temperature of the obtained white light source was 6020 K, and the emission spectrum characteristic $(P(\lambda) \times V(\lambda))/(P(\lambda max1) \times V(\lambda max1))$ was as shown in FIG. 23. A curve obtained by $(B(\lambda) \times V(\lambda))/(B(\lambda max2) \times V(\lambda max2))$ in the spectrum of black-body radiation having a corresponding color temperature of 6020 K, was shown in FIG. 24. A differential spectrum $(P(\lambda) \times V(\lambda))/(P(\lambda max1) \times V(\lambda max1)) - (B(\lambda) \times V(\lambda))/(B(\lambda max2) \times V(\lambda max2))$ between FIGS. 23 and 24 was as shown in FIG. 25. As is apparent from the curve shown in FIG. 25, the differential spectrum was distributed within the range of −0.12 to +0.02. It was found that the relation of inequality (2) was satisfied at each wavelength within the range of 350 nm to 800 nm.

A reflector, a lens, a cover, and the like were attached to the LED module, and an electronic circuit was also connected to form the white light source used in the system according to the present invention. The luminous efficiency of the white light source was 64 lm/W. The intensity of LED primary light leaked from the white light source was 0.08 mW/lm, and it was found that the intensity of leaked ultraviolet rays was not problematic. A general color rendering index Ra of the white light source was 97.

Example 6

White light source 6 used in the system according to the present invention was manufactured.

A white light source was manufactured by combining three types of phosphors, that is, a blue phosphor, a yellow phosphor, and a red phosphor, and an LED. As the LED, an LED having a light emission peak at 405 nm and configured to emit violet or ultraviolet light was used. As the phosphors, a europium activated alkaline earth phosphate blue phosphor having a peak wavelength of 450 nm, a europium activated orthosilicate yellow phosphor having a peak wavelength of 560 nm, and a europium activated alkaline earth nitridoaluminosilicate phosphor having a peak wavelength of 655 nm were prepared. The phosphors were mixed at a weight ratio of blue phosphor:yellow phosphor:red phosphor=82:9:9. A powder having an average particle size of 30 to 35 μm was used for each phosphor. A phosphor slurry prepared by dispersing phosphor particles in a silicone resin was applied to cover an LED chip placed on a substrate, thereby manufacturing an LED module. The film thickness of phosphor film was about 730 μm.

Figure 26:
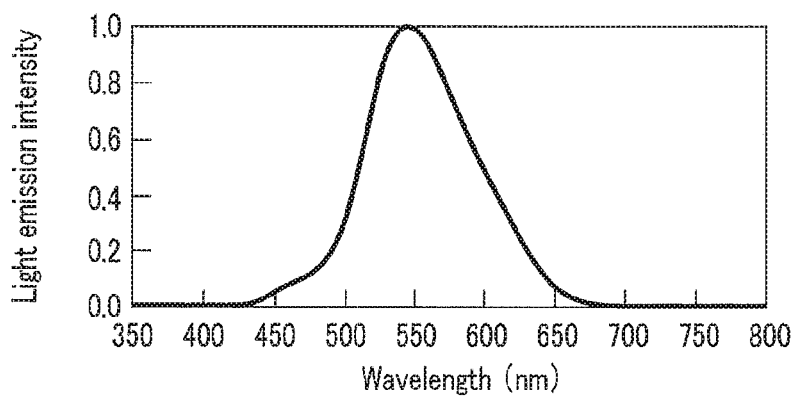
FIG. 26 is a graph showing $(P(\lambda) \times V(\lambda))/(P(\lambda max1) \times V(\lambda max1))$ of a white light source according to Example 6.
Figure 27:
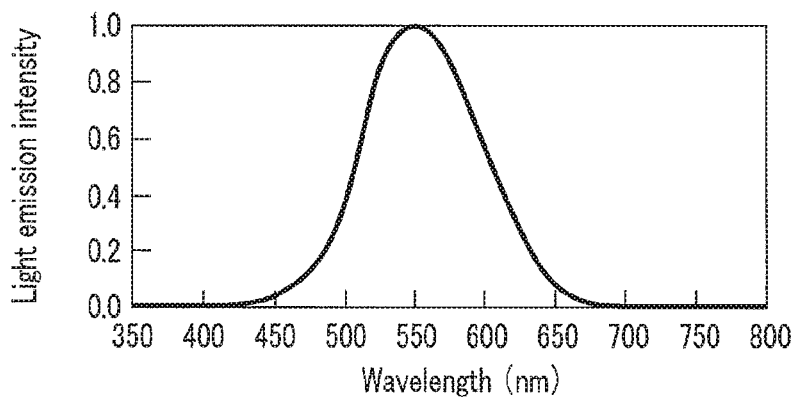
FIG. 27 is a graph showing $(B(\lambda) \times V(\lambda))/(B(\lambda max2) \times V(\lambda max2))$ of black-body radiation according to Example 6.

The color temperature of the obtained white light source was 6785 K, and the emission spectrum characteristic $(P(\lambda) \times V(\lambda))/(P(\lambda max1) \times V(\lambda max1))$ was as shown in FIG. 26. A curve obtained by $(B(\lambda) \times V(\lambda))/(B(\lambda max2) \times V(\lambda max2))$ in the spectrum of black-body radiation having a corresponding color temperature of 6785 K, was shown in FIG. 27. A differential spectrum $(P(\lambda) \times V(\lambda))/(P(\lambda max1) \times V(\lambda max1)) - (B(\lambda) \times V(\lambda))/(B(\lambda max2) \times V(\lambda max2))$ between FIGS. 26 and 27 was as shown in FIG. 28. As is apparent from the curve shown in FIG. 28, the differential spectrum was distributed within the range of −0.125 to +0.015. It was found that the relation of inequality (2) was satisfied at each wavelength within the range of 350 nm to 800 nm.

A reflector, a lens, a cover, and the like were attached to the LED module, and an electronic circuit was also connected to form the white light source used in the system according to the present invention. The luminous efficiency of the white light source was 60 lm/W. The intensity of LED primary light leaked from the white light source was 0.14 mW/lm, and it was found that the intensity of leaked ultraviolet rays was not problematic. A general color rendering index Ra of the white light source was 97.

Comparative Example 1

White light source 7 used in a system according to a comparative example was manufactured.

A white light source was manufactured by combining a yellow phosphor and an LED. As the LED, a blue light emitting LED having a light emission peak at 448 nm was used. As the phosphor, a europium activated orthosilicate green phosphor having a peak wavelength of 560 nm was used. A powder having an average particle size of 7 μm was used for the phosphor. A phosphor slurry prepared by dispersing phosphor particles in a silicone resin was evenly applied to cover an LED chip placed on a substrate, thereby manufacturing an LED module. As a result of adjusting the thickness to obtain desired white light upon mixing blue light of the LED and yellow light of the phosphor, the film thickness of the phosphor film was about 65 μm.

Figure 30:
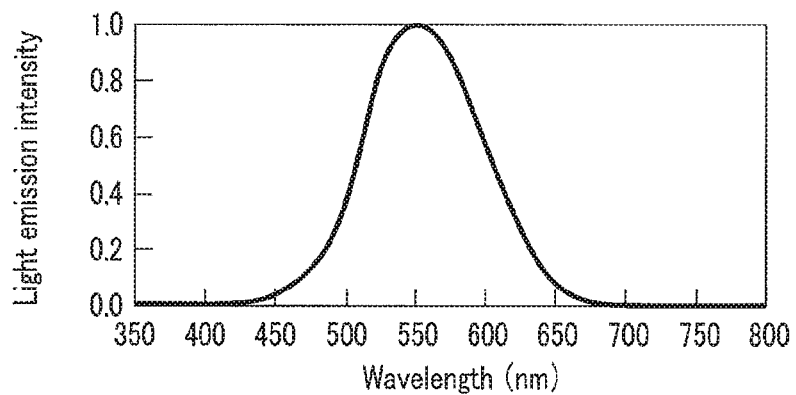
FIG. 30 is a graph showing $(B(\lambda) \times V(\lambda))/(B(\lambda max2) \times V(\lambda max2))$ of black-body radiation according to Comparative Example 1.
Figure 31:
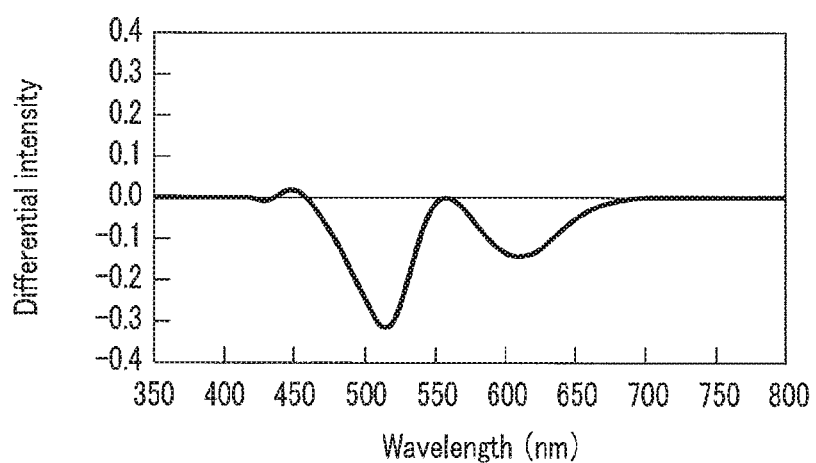
FIG. 31 is a graph showing a differential spectrum $(P(\lambda) \times V(\lambda))/(P(\lambda max1) \times V(\lambda max1)) - (B(\lambda) \times V(\lambda))/(B(\lambda max2) \times V(\lambda max2))$ between the white light source according to Comparative Example 1 and the spectrum of black-body radiation having a color temperature corresponding to the color temperature of the white light source.

The color temperature of the obtained white light source was 6338 K, and the emission spectrum characteristic $(P(\lambda) \times V(\lambda))/(P(\lambda max1) \times V(\lambda max1))$ was as shown in FIG. 29. A curve obtained by $(B(\lambda) \times V(\lambda))/(B(\lambda max2) \times V(\lambda max2))$ in the spectrum of black-body radiation having a corresponding color temperature of 6338 K, was shown in FIG. 30. A differential spectrum $(P(\lambda) \times V(\lambda))/(P(\lambda max1) \times V(\lambda max1)) - (B(\lambda) \times V(\lambda))/(B(\lambda max2) \times V(\lambda max2))$ between FIGS. 29 and 30 was as shown in FIG. 31. As is apparent from the curve shown in FIG. 31, the differential spectrum was distributed within the range of −0.32 to +0.02. It was found that the relation of inequality (2) could not be satisfied, and a large value of 0.34 outside the range was exhibited.

A reflector, a lens, a cover, and the like were attached to the LED module, and an electronic circuit was also connected to form the white light source according to the comparative example. The luminous efficiency of the white light source was 71 lm/W, and light emission of a high efficiency was exhibited. However, a general color rendering index Ra was 70, which was an extremely low value. As described above, the white light source according to the comparative example apparently exhibited the same white light emission as the present invention, but emitted less reddish light and exhibited poor color rendering properties. If such a light source is used for an illumination in, for example, a sickroom, a patient's face looks pale, resulting in an adverse effect on minds. Additionally, there is a fear of impairment such as blue-light hazard caused by the influence of strong blue light emitted by the LED.

Example 7

White light source system 1 according to the present invention was manufactured using three types of light sources, that is, white light sources 1, 3, and 6. A control circuit and a power supply were connected to each white light source, the value of a current flowing to each white light source was adjusted to an arbitrary value, and white light beams emitted by the white light sources were mixed at an arbitrary ratio, thereby obtaining a white light source system capable of obtaining white light beams of various color temperatures from 2074 K to 6785 K. The color temperature of obtained white light was represented by a point on two lines connecting three points 2074 K (P1), 4029 K (P2), and 6785 K (P3) on a black body locus shown in FIG. 32. The white light source having a color temperature of 6785 K and the white light source having a color temperature of 4029 K were mixed at an arbitrary ratio, thereby changing the color temperature of white light emitted by white light source system 1 within the range of 4029 K to 6785 K. In addition, the white light source having a color temperature of 4029 K and the white light source having a color temperature of 2074 K were mixed at an arbitrary ratio, thereby changing the color temperature of white light emitted by white light source system 1 within the range of 2074 K to 4029 K. In this way, two white light sources were selected such that the difference between the color temperatures became small, and mixed at an arbitrary ratio, thereby causing white light source system 1 to emit white light. As a result, as is apparent from FIG. 32, the deviation of the color temperature of the white light source obtained by white light source system 1 from the black body locus exhibited a value of 0.005 duv or less within the range of 2074 K to 6785 K. The general color rendering index of white light obtained by this system was 97.

Example 8

Figure 33:
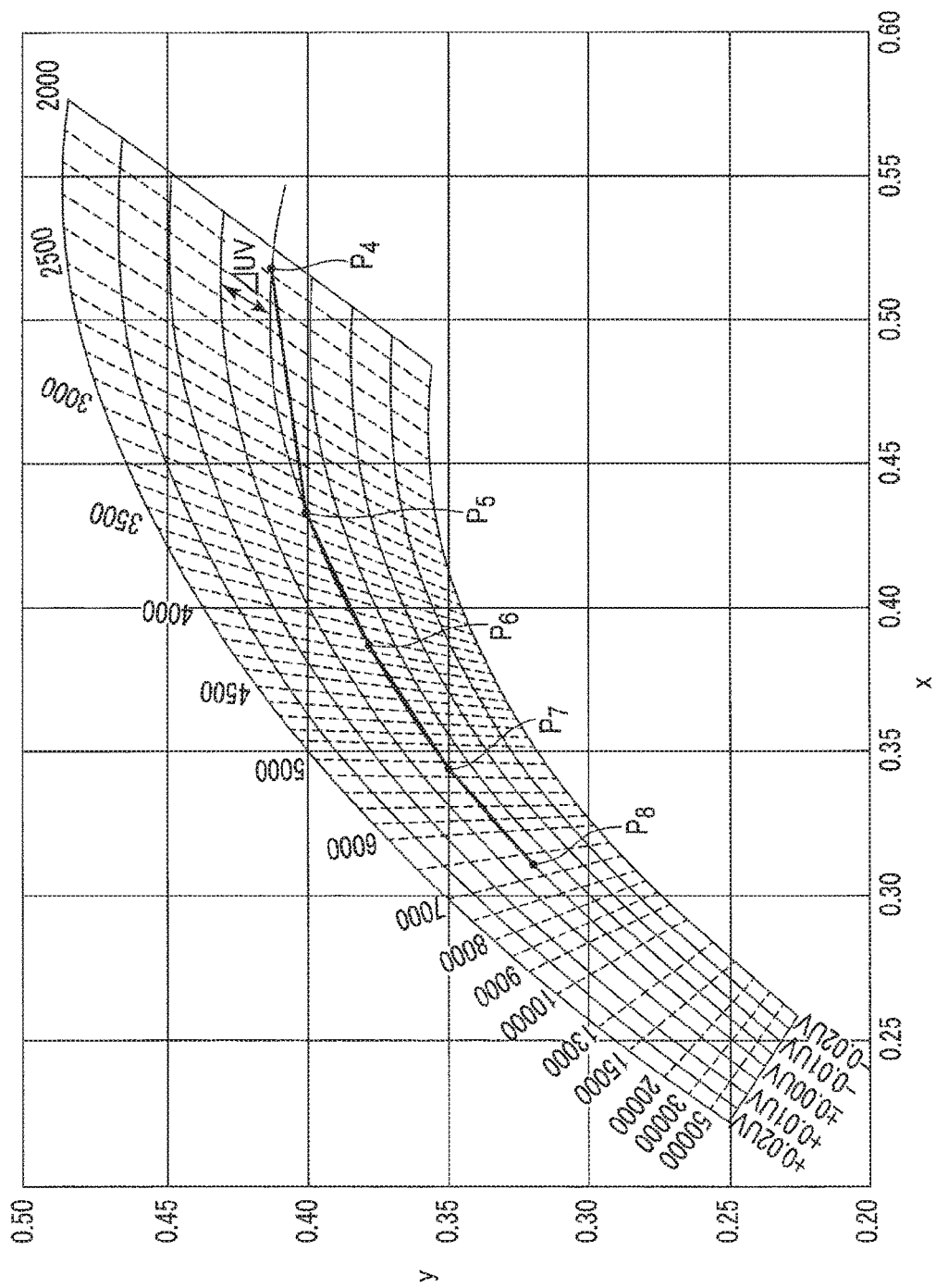
FIG. 33 is a graph showing the reproduction region of color temperatures by a white light source system according to Example 8.

White light source system 2 according to the present invention was manufactured using four types of light sources, that is, white light sources 1, 2, 4, and 6. A control circuit and a power supply were connected to each white light source, the value of a current flowing to each white light source was adjusted to an arbitrary value, and white light beams emitted by the white light sources were mixed at an arbitrary ratio, thereby obtaining a white light source system capable of obtaining white light beams of various color temperatures from 2074 K to 6785 K. The color temperature of obtained white light was represented by a point on four lines connecting five points 2074 K (P4), 3077 K (P5), 4029 K (P6), 5085 K (P7), and 6785 K (P8) on a black body locus shown in FIG. 33. The white light source having a color temperature of 6785 K and the white light source having a color temperature of 5085 K were mixed at an arbitrary ratio, thereby changing the color temperature of white light emitted by white light source system 2 within the range of 5085 K to 6785 K. In addition, the white light source having a color temperature of 5085 K and the white light source having a color temperature of 4029 K were mixed at an arbitrary ratio, thereby changing the color temperature of white light emitted by white light source system 2 within the range of 4029 K to 5085 K. The white light source having a color temperature of 4029 K and the white light source having a color temperature of 3077 K were mixed at an arbitrary ratio, thereby changing the color temperature of white light emitted by white light source system 2 within the range of 3077 K to 4029 K. The white light source having a color temperature of 3077 K and the white light source having a color temperature of 2074 K were mixed at an arbitrary ratio, thereby changing the color temperature of white light emitted by white light source system 2 within the range of 2074 K to 3077 K. In this way, two white light sources were selected such that the difference between the color temperatures became small, and mixed at an arbitrary ratio, thereby causing white light source system 2 to emit white light. As a result, as is apparent from FIG. 33, the deviation of the color temperature of the white light source obtained by white light source system 2 from the black body locus exhibited a value of 0.0025 duv or less within the range of 2074 K to 6785 K. The general color rendering index of white light obtained by this system was 97.

Example 9

Figure 34:
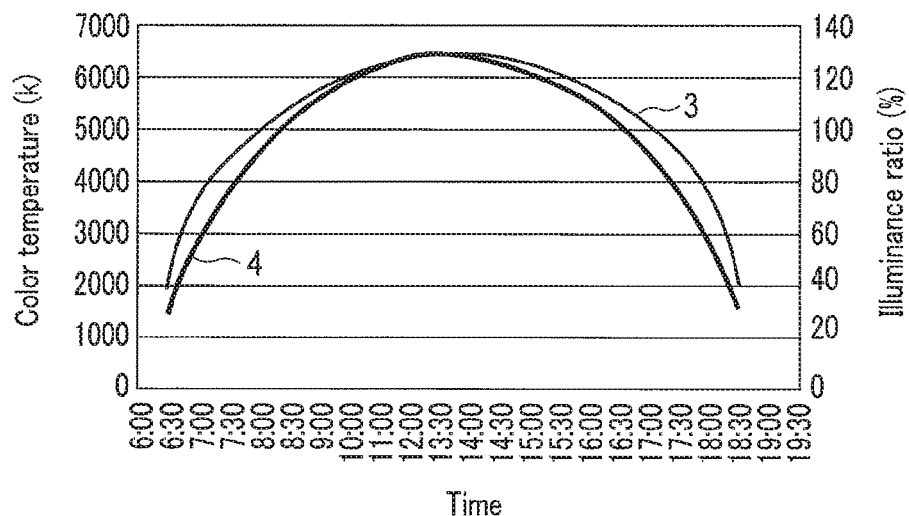
FIG. 34 is a graph showing changes in the color temperature and illuminance of sunbeams in one day of autumn in Naha, Okinawa, Japan.

Sunbeams from sunrise to sunset in autumn in Naha, Okinawa were reproduced using white light source system 1. FIG. 34 is a graph showing changes in the color temperature and illuminance of sunbeams from about 6:30 in the morning to about 6:30 in the evening. Curve 3 in FIG. 34 is a curve representing the change in the color temperature, and curve 4 is a curve representing the change in the illuminance. It became bright from sunrise. The illuminance is highest at about 12:00. After that, the high illuminance state continued up to about 14:00, and the illuminance gradually lowered to the sunset. On the other hand, as for the color temperature, the sun that was bright red and had a color temperature of 2000 K appeared at sunrise. Along with the increase in the illuminance, the color temperature also rose. The color changed from warm white to white and then to daytime white. At about 14:00, the color temperature was highest, and daylight color of 6500 K was obtained. The process after that was reverse to that in the morning. The color temperature returned to 2000 K at about 18:30, and the sun sank.

The white light source system according to the present invention reproduced the time-rate changes in the color temperature and illuminance shown in FIG. 34 by controlling the value of a current supplied to each white light source. First, to obtain white light having a specific color temperature, the ratio of currents to be supplied to the plural of white light sources was decided. Next, to cope with the change in the illuminance, the intensity of the total current was adjusted to obtain a predetermined illuminance while maintaining the above current ratio. The white light source system according to the present invention performed program control of the current values such that the adjustment could be done based on actual measurement values every three minutes for the time-rate change data shown in FIG. 34, thereby reproducing the time-rate change in sunbeams.

Such a white light source system was used as an indoor illumination of an office. The illumination according to the present invention reproduces not the instantaneous characteristic of sunbeams but a light emission characteristic that changes hour by hour, and is expected to have a favorable influence on the internal clock of a human body and the like. A characteristic change by white illumination reproduces a moderate change that the human eye cannot discriminate, and is therefore perceived by the human as a very natural change like sunbeams. Hence, the illumination can be accepted as an illumination that is comfortable and gentle to the bodies of modern people who are forced to work indoors for a long time.

Example 10

Figure 35:
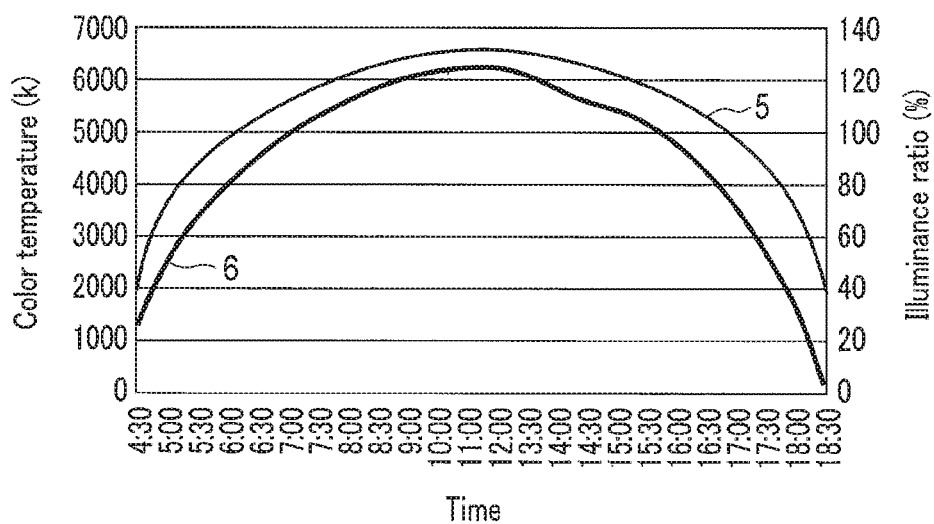
FIG. 35 is a graph showing changes in the color temperature and illuminance of sunbeams in one day of summer in Los Angeles, U.S.A.
Figure 37:
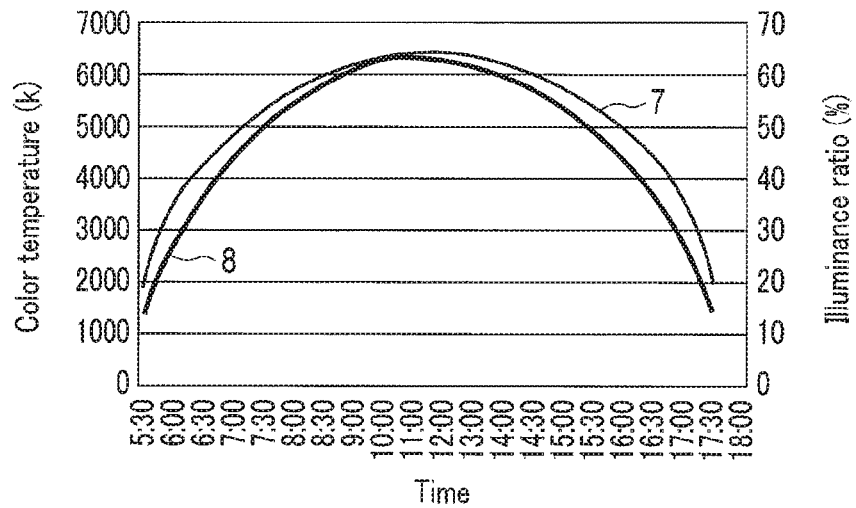
FIG. 37 is a graph showing changes in the color temperature and illuminance of sunbeams in one day of spring in Wakkanai, Hokkaido, Japan.
Figure 38:
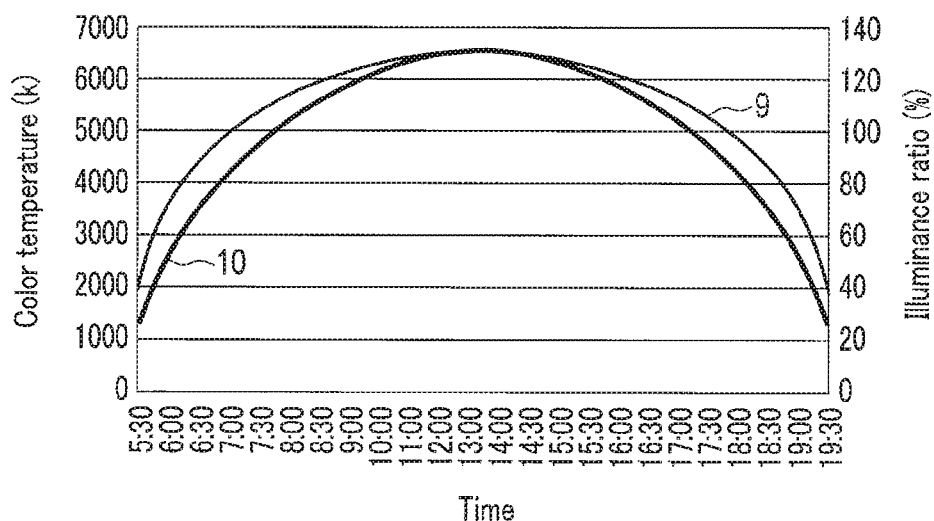
FIG. 38 is a graph showing changes in the color temperature and illuminance of sunbeams in one day of summer in Taipei, Taiwan.
Figure 39:
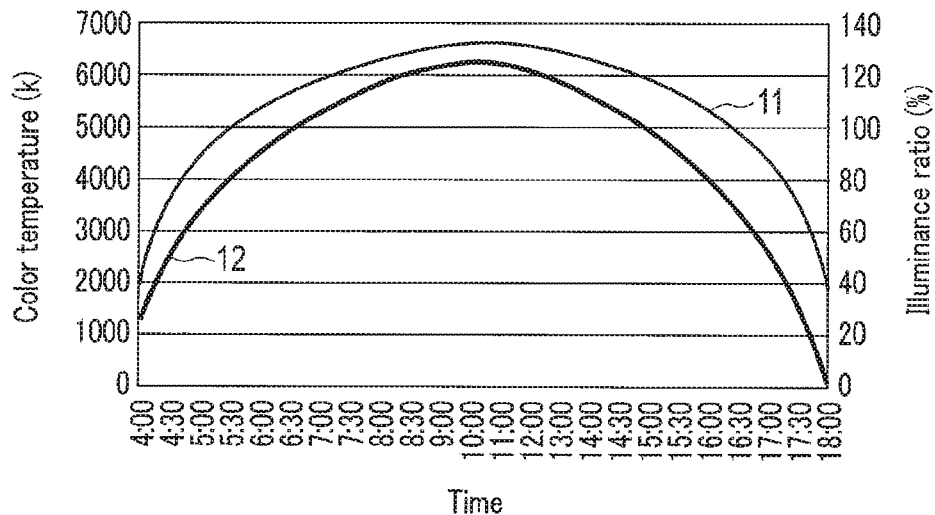
FIG. 39 is a graph showing changes in the color temperature and illuminance of sunbeams in one day of summer in Wakkanai, Hokkaido, Japan.
Figure 40:
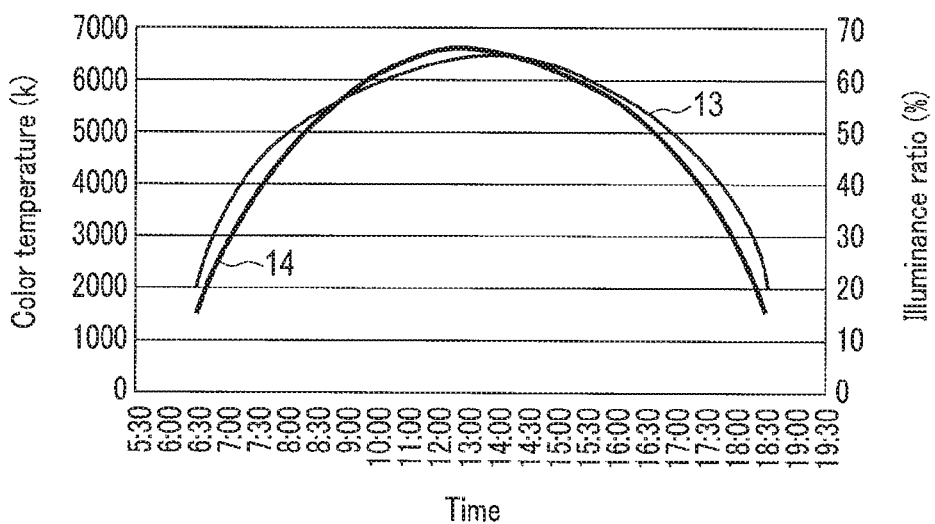
FIG. 40 is a graph showing changes in the color temperature and illuminance of sunbeams in one day of winter in Naha, Okinawa, Japan.

Sunbeams from sunrise to sunset in summer in Los Angeles, U.S.A. were reproduced using white light source system 2. FIG. 35 is a graph showing tracking of changes in the color temperature and illuminance of sunbeams from about 4:30 in the morning to about 6:30 in the evening. Curve 5 in FIG. 35 is a curve representing the change in the color temperature, and curve 6 is a curve representing the change in the illuminance. The highest color temperature was 6600 K from about 11:00 to about 12:00. The time when the illuminance was highest was about 11:00 to about 12:00, like the color temperature. The illuminance is highest in summer of the seasons. As compared to winter when the lowest illuminance is exhibited in Los Angeles, the illuminance ratio is 175%, and the difference is large.

The white light source system according to the present invention reproduced the time-rate changes in the color temperature and illuminance shown in FIG. 35 by controlling the value of a current supplied to each white light source based on actual measurement values every three minutes. This white light source system was employed as a general illumination at home. The illumination reproduces not the instantaneous characteristic of sunbeams but a light emission characteristic that changes hour by hour in a natural form. The illumination could create artificial sunbeams even in a room where the sunbeams did not enter. Such an illumination has a favorable influence on the health of a human body. Additionally, even if the illumination is used for an application purpose in a general home as an ultra-high color rendering illumination exhibiting a general color rendering index Ra of 97, an excellent characteristic feature is exhibited.

Comparative Example 2

White light source system 3 according to a comparative example was manufactured using white light source 1 of the example and white light source 7 of the comparative example. A control circuit and a power supply were connected to each white light source, the value of a current flowing to each white light source was adjusted to an arbitrary value, and white light beams emitted by the white light sources were mixed at an arbitrary ratio, thereby obtaining a white light source system capable of obtaining white light beams of various color temperatures from 2074 K to 6338 K. The color temperature of obtained white light was represented by a point on a line connecting two points 2074 K (P9) and 6338 K (P10) on a black body locus shown in FIG. 36. Hence, as is apparent from FIG. 36, as for the color temperature of the white light source obtained by white light source system 3, white light having a color temperature on the black body locus was obtained only at the two points of 2074 K and 6338 K. At an intermediate color temperature except these, however, only white light with a large deviation from the black body locus was obtained. Especially, near 3500 K, a large deviation more than 0.01 duv was obtained.

An illumination using white light source system 3 according to the comparative example could not accurately reproduce a color temperature on the black body locus. In addition, since a shape difference existed between the emission spectra of white light source system 3 and the emission spectra of black-body radiation having the color temperature, white light having a natural tone close to sunbeams could not be obtained. As far as 2074 K is concerned, the reproduction level of sunbeams was the same as the light sources of the examples of the present invention. However, as the color temperature rose, the deviation became large. At 6338 K, only unnatural white light containing a strong blue component was exhibited. Furthermore, this system could obtain white light beams having various color temperatures. However, the tone needed to be adjusted every time. For this reason, white light of the same color temperature continued for a long time, or the color temperature exhibited an unnatural change, for example, largely changed every time the tone is switched. Hence, only an illumination largely different from the natural change of sunbeams could be obtained.

Examples 11 to 16

A pattern is selected, on a season basis or depending on the latitude or longitude, from a plural of change patterns including a change pattern that changes on a period basis and a change pattern that changes on a location basis, thereby reproducing sunbeams at various locations or in various seasons in the examples as follows.

Example 11

Wakkanai, Hokkaido in spring, time from about 5:30 to about 17:30, color temperature from 2000 K to 6500 K Example 12

Taipei, Taiwan in summer, time from about 5:30 to about 19:30, color temperature from 2000 K to 6600 K Example 13

Wakkanai, Hokkaido in summer, time from about 4:00 to about 18:00, color temperature from 2000 K to 6600 K Example 14

Naha, Okinawa in winter, time from about 6:30 to about 18:30, color temperature from 2000 K to 6500 K Example 15

Tokyo, Japan in winter, time from about 5:30 to about 17:30, color temperature from 2000 K to 6500 K Example 16

Wakkanai, Hokkaido in winter, time from about 5:30 to about 17:30, color temperature from 2000 to 6500 K Changes in the color temperature and changes in the illuminance are shown in FIGS. 37, 38, 39, 40, 41, and 42 in the order. Referring to FIGS. 37, 38, 39, 40, 41, and 42, curves representing the changes in the color temperature are indicated by 7, 9, 11, 13, 15, and 17. Curves representing the changes in the illuminance are indicated by 8, 10, 12, 14, 16, and 18. The white light source system according to the present invention reproduced the time-rate changes in the color temperature and illuminance shown in FIGS. 37, 38, 39, 40, 41, and 42 by controlling the value of a current supplied to each white light source based on actual measurement values every three minutes. When such a light source is used as an illumination for a hospital, an office, or a general home, it can be used as a high color rendering illumination for various purposes such as medical aid, health promotion, and creation of a comfortable space.

Note that the general color rendering index Ra is obtained by obtaining the data of light emission spectrum intensity at an interval of 5 nm within the wavelength range of 380 nm to 780 nm and performing a calculation in accordance with a method described in JIS-8726.

While certain embodiments of the inventions have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The appended claims and their equivalents are intended to cover such forms or modifications as would fall within the scope and spirit of the inventions.

What is claimed is:

1. A white light source system comprising white light sources each having a general color rendering index of not less than 97, wherein an absolute value of a difference between $(P(\lambda) \times V(\lambda))/(P(\lambda max1) \times V(\lambda max1))$ and $(B(\lambda) \times V(\lambda))/(B(\lambda max2) \times V(\lambda max2))$ for each of the white light sources satisfies a relational expression represented by $$|((P(\lambda) \times V(\lambda))/(P(\lambda max1) \times V(\lambda max1))) - (B(\lambda) \times V(\lambda))/(B(\lambda max2) \times V(\lambda max2))| \leq 0.15$$

where the $P(\lambda)$ is an emission spectrum of the each white light source, the $B(\lambda)$ is an emission spectrum of black-body radiation having a color temperature corresponding to a color temperature of the each white light source, the $V(\lambda)$ is a spectrum of a spectral luminous efficiency, the $\lambda max1$ is a wavelength that maximizes $P(\lambda) \times V(\lambda)$, and the $\lambda max2$ is a wavelength that maximizes $B(\lambda) \times V(\lambda)$, wherein the white light source system has a light emission characteristic of white light emitted by the system is continuously changed along with an elapse of time by changing a mixing ratio of light beams from the white light sources.

2. The white light source system according to claim 1, wherein a time-rate change in the light emission characteristic of the white light progresses in accordance with a pattern selected from change patterns based on a result of actual measurement of a change in sunbeams in one day.

3. The white light source system according to claim 2, wherein the change patterns include a change pattern that changes on a period basis and a change pattern that changes on a location basis, and the pattern can be selected from the change patterns on a season basis or depending on a latitude or a longitude.

4. The white light source system according to claim 1, wherein the white light sources comprise at least three types of white light sources which satisfy the relational expression and have different color temperatures, and two types of white light sources are selected from the at least three types of white light sources and have different color temperatures in a descending order or ascending order and mixed, thereby obtaining, as the white light emitted by the system, a white light having a color temperature based on a black body locus of 2000 K to 6500 K and a deviation with respect to the color temperature is not more than ±0.005 duv.

5. The white light source system according to claim 4, wherein the white light sources comprise three types of white light sources having different color temperatures.

6. The white light source system according to claim 5, wherein in the three types of white light sources, a white light source having a highest color temperature has a color temperature of not more than 6500 K, a white light source having a lowest color temperature has a color temperature of not less than 2000 K, and a white light source having an intermediate color temperature between the color temperatures has a color temperature ranging from 2950 K to 4050 K.

7. The white light source system according to claim 2, wherein the white light sources comprise at least three types of white light sources which satisfy the relational expression and have different color temperatures, and two types of white light sources are selected from the at least three types of white light sources and have different color temperatures in a descending order or ascending order and mixed, thereby obtaining, as the white light emitted by the system, a white light having a color temperature based on a black body locus of 2000 K to 6500 K and a deviation with respect to the color temperature is not more than ±0.005 duv.

8. The white light source system according to claim 1, wherein the each white light source includes a light emitting diode and a phosphor, the light emitting diode emits ultraviolet or violet primary light having a peak wavelength of 350 nm to 420 nm, and the phosphor absorbs the primary light from the light emitting diode and converts the primary light into a white secondary light.

9. The white light source system according to claim 8, wherein the phosphor is formed by mixing at least three types of phosphors selected from the group consisting of a blue emitting phosphor, a green emitting phosphor, a yellow emitting phosphor, and a red emitting phosphor.

10. The white light source system according to claim 9, wherein the phosphor is formed by mixing the blue emitting phosphor at a ratio of 45 parts by weight to 75 parts by weight, the green light emitting phosphor at a ratio of 3 parts by weight to 7 parts by weight, the yellow light emitting phosphor at a ratio of 9 parts by weight to 17 parts by weight, and the red phosphor at a ratio of 9 parts by weight to 18 parts, and a total amount of the phosphors is 100 parts by weight.

11. The white light source system according to claim 10, wherein the blue emitting phosphor is a europium activated alkaline earth phosphate phosphor, the green emitting phosphor is a europium and manganese activated alkaline earth magnesium silicate phosphor, the yellow emitting phosphor is a europium and manganese activated alkaline earth magnesium silicate phosphor, and the red emitting phosphor is a europium activated calcium nitridoaluminosilicate phosphor.

12. The white light source system according to claim 9, wherein the blue emitting phosphor is a europium activated alkaline earth phosphate phosphor, the green emitting phosphor is a europium and manganese activated alkaline earth magnesium silicate phosphor, the yellow emitting phosphor is a europium and manganese activated alkaline earth magnesium silicate phosphor, and the red emitting phosphor is a europium activated calcium nitridoaluminosilicate phosphor.

* * * * *